US007606010B2

(12) United States Patent
Parkin

(10) Patent No.: US 7,606,010 B2
(45) Date of Patent: *Oct. 20, 2009

(54) MG-ZN OXIDE TUNNEL BARRIERS AND METHOD OF FORMATION

(75) Inventor: Stuart Stephen Papworth Parkin, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 136 days.

This patent is subject to a terminal disclaimer.

(21) Appl. No.: 11/777,219

(22) Filed: Jul. 12, 2007

(65) Prior Publication Data

US 2008/0138660 A1 Jun. 12, 2008

Related U.S. Application Data

(60) Division of application No. 10/982,075, filed on Nov. 5, 2004, now Pat. No. 7,252,852, which is a continuation of application No. 10/734,425, filed on Dec. 12, 2003, now abandoned.

(51) Int. Cl.
*G11B 5/39* (2006.01)
(52) U.S. Cl. .............. 360/324.2; 428/811.1; 428/811.5; 428/812; 428/813
(58) Field of Classification Search ................ None
See application file for complete search history.

(56) References Cited

U.S. PATENT DOCUMENTS

| | | | |
|---|---|---|---|
| 6,674,617 B2 * | 1/2004 | Gill | 360/324.12 |
| 6,767,655 B2 * | 7/2004 | Hiramoto et al. | 428/811.2 |
| 6,791,792 B2 | 9/2004 | Takahashi | |
| 6,963,096 B2 | 11/2005 | Schmidt et al. | |
| 7,212,385 B2 | 5/2007 | Hayakawa | |
| 7,252,852 B1 | 8/2007 | Parkin | |
| 7,270,896 B2 * | 9/2007 | Parkin | 428/811.1 |
| 7,274,080 B1 | 9/2007 | Parkin | |
| 7,276,384 B2 | 10/2007 | Parkin et al. | |

(Continued)

FOREIGN PATENT DOCUMENTS

WO 02/075344 A2 9/2002

(Continued)

OTHER PUBLICATIONS

Krishnamoorthy S., Illiadis, A., Inumpudi, A., Choopun, S., Vispute, R., and Venkatesan, T., "Resonant tunneling action in ZnO/Zn0. 8Mg0.2O double barrier devices", Semiconductor Device Research Symposium, 2001, pp. 450-453.*

(Continued)

*Primary Examiner*—Kevin M Bernatz
(74) *Attorney, Agent, or Firm*—Daniel E. Johnson

(57) ABSTRACT

ZnMg oxide tunnel barriers are grown which, when sandwiched between ferri- or ferromagnetic layers, form magnetic tunnel junctions exhibiting high tunneling magnetoresistance (TMR). The TMR may be increased by annealing the magnetic tunnel junctions. The zinc-magnesium oxide tunnel barriers may be incorporated into a variety of other devices, such as magnetic tunneling transistors and spin injector devices. The ZnMg oxide tunnel barriers are grown by first depositing a zinc and/or magnesium layer onto an underlying substrate in oxygen-poor (or oxygen-free) conditions, and subsequently depositing zinc and/or magnesium onto this layer in the presence of reactive oxygen.

22 Claims, 21 Drawing Sheets

U.S. PATENT DOCUMENTS

| | | | |
|---|---|---|---|
| 7,300,711 | B2 | 11/2007 | Parkin |
| 7,345,855 | B2 * | 3/2008 | Parkin ..................... 360/324.2 |
| 7,349,187 | B2 * | 3/2008 | Parkin ..................... 360/324.2 |
| 7,351,483 | B2 * | 4/2008 | Parkin ..................... 428/811.1 |
| 7,357,995 | B2 * | 4/2008 | Parkin ..................... 428/811.1 |
| 7,443,639 | B2 * | 10/2008 | Parkin ..................... 360/324.2 |
| 2002/0114112 | A1 | 8/2002 | Nakashio et al. |
| 2003/0008416 | A1 | 1/2003 | Shimura et al. |
| 2003/0157373 | A1 | 8/2003 | Kirino et al. |
| 2004/0144995 | A1 | 7/2004 | Nagahama et al. |
| 2004/0234815 | A1 | 11/2004 | Drewes |
| 2005/0094327 | A1 | 5/2005 | Okuno et al. |
| 2006/0164759 | A1 | 7/2006 | Okada et al. |
| 2007/0154740 | A1 | 7/2007 | Yuasa et al. |
| 2007/0259213 | A1 * | 11/2007 | Hashimoto et al. ........ 428/811.2 |
| 2008/0138660 | A1 | 6/2008 | Parkin |
| 2008/0145952 | A1 | 6/2008 | Parkin |
| 2008/0182015 | A1 | 7/2008 | Parkin |
| 2008/0182342 | A1 | 7/2008 | Parkin |
| 2008/0291584 | A1 * | 11/2008 | Parkin ..................... 360/324.2 |

FOREIGN PATENT DOCUMENTS

| | | | |
|---|---|---|---|
| WO | 02/099905 | A1 | 12/2002 |

OTHER PUBLICATIONS

Butler, W., Zhang, X., Schulthess, T., and MacLaren, J., "Spin-dependent tunneling conductance of Fe|MgO|Fe sandwiches", Phys. Rev. B, 63, 2001, 054416-1—054416-12.*

Tsunoda, M., Nishikawa, K., Ogata, S., and Takahashi, M., "60% magnetoresistance at room temperature in Co-Fe/Al-O/Co-Fe tunnel junctions oxidized with Kr-O2 plasma", App. Phys. Let., 80(17), Apr. 2002, 3135—3137.*

Yuasa, S., Fukushima, A., Nagahama, T., Ando, K., and Suzuki, Y., "High tunnel magnetoresistance at room temperature in fully epitaxial Fe/MgO/Fe tunnel junctions due to coherent spin-polarized tunneling", Jap. J. App. Phys., 43(4B), 2004, pp. L588-L590.*

Yuasa, "High Tunnel Magnetoresistance at Room Temperature in Fully Epitaxial Fe/MgO/Fe Tunnel Junctions due to Coherent Spin-Polarized Tunneling," Japanese Journal of Applied Physics, 2004, pp. L588-L590, vol. 43, No. 4B, The Japan Society of Applied Physics, Japan.

Motsnyi, "Electrical spin injection in a ferromagnet/tunnel barrier/semiconductor heterostructure," Applied Physics Letters, Jul. 8, 2002, pp. 265-267, vol. 81, No. 2, American Institute of Physics, USA.

Manago, "Spin-polarized light-emitting diode using metal/insulator/semiconductor structures," Applied Physics Letters, Jul. 22, 2002, pp. 694-696, vol. 81, No. 4, American Institute of Physics, USA.

Nishimura et al.; Magnetic tunnel junction device with perpendicular magnetization films for high-density magnetic random access memory; (J. App. Phys.,V91(8), Apr. 2002, pp. 5246-5249.

* cited by examiner

MG-ZN OXIDE TUNNEL BARRIERS AND METHOD OF FORMATION

This application is a divisional of Applicant's U.S. application Ser. No. 10/982,075 filed Nov. 5, 2004 and titled "Mg—Zn oxide tunnel barriers and method of formation" (now U.S. Pat. No. 7,252,852), which in turn is a continuation of Applicant's U.S. application Ser. No. 10/734,425 filed Dec. 12, 2003 and titled "Mg—Zn oxide tunnel barriers and method of formation" (now abandoned), which are hereby incorporated herein by reference.

The U.S. Government has a paid-up license in this invention and the right in limited circumstances to require the patent owner to license others on reasonable terms as provided for by the terms of contract MDA972-99-C-0009 awarded by DARPA.

TECHNICAL FIELD

The invention relates to magnetic tunnel junction (MTJ) magnetoresistive (MR) elements for use as: magnetic field sensors in read heads for reading magnetically recorded data, in memory cells of nonvolatile magnetic random access memory (MRAM) devices, and in devices for magnetic logic and spintronic applications. More particularly, this invention relates to MTJ devices with improved tunneling barriers formed from Zn—Mg oxides and a method of forming such tunnel barriers.

BACKGROUND OF THE INVENTION

The basic component of a magnetic tunnel junction is a sandwich of two thin ferromagnetic and/or ferrimagnetic layers separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ has its magnetic moment fixed or pinned, so that its magnetic moment is unaffected by the presence of the magnetic fields applied to the device during its operation. The other ferromagnetic layer in the sandwich is the free or sensing layer, whose moment responds to magnetic fields applied during operation of the device. In the quiescent state, in the absence of any applied magnetic field within the memory cell, the sensing layer magnetic moment is designed to be either parallel (P) or anti-parallel (AP) to the magnetic moment of the pinned ferromagnetic layer. For a TMR field sensor for read head applications, one of the ferromagnetic layers has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

FIG. 1 illustrates a cross-section of a conventional prior-art MTJ device. The MTJ 100 includes a bottom "fixed" ferromagnetic (F) layer 18, an insulating tunnel barrier layer 24, and a top "free" ferromagnetic layer 34. The MTJ 100 has bottom and top electrical leads 12 and 36, respectively, with the bottom lead being formed on a suitable substrate 11, such as a silicon oxide layer. The ferromagnetic layer 18 is called the fixed layer because its magnetic moment is prevented from rotating in the presence of an applied magnetic field in the desired range of interest for the MTJ device, e.g., the magnetic field caused by the write current applied to the memory cell from the read/write circuitry of the MRAM or the magnetic field from the recorded magnetic layer in a magnetic recording disk. The magnetic moment of the ferromagnetic layer 18, whose direction is indicated by the arrow 90 in FIG. 1, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest. In the absence of an applied magnetic field, the moments of the ferromagnetic layers 18 and 34 are aligned generally parallel (or anti-parallel) in an MTJ memory cell (as indicated by the double-headed arrow 80 in FIG. 1) and generally perpendicular in a MTJ magnetoresistive read head. The relative orientation of the magnetic moments of the ferromagnetic layers 18, 34 affects the tunneling current and thus the electrical resistance of the MTJ device. The bottom lead 12, the antiferromagnetic layer 16, and the fixed ferromagnetic layer 18 together may be regarded as constituting the lower electrode 10.

The basic concept of a magnetic tunnel junction was first realized in 1975 (M. Julliére, "*Tunneling between ferromagnetic films*", Phys. Lett. 54A, 225 (1975)) although the TMR was very small and observed only at low temperatures and for very small bias voltages. In 1995 significant TMR effects of about 10% were obtained at room temperature in MTJs with $Al_2O_3$ tunnel barriers by two different groups (J. S. Moodera et al., "*Large magnetoresistance at room temperature in ferromagnetic thin film tunnel junctions*", Phys. Rev. Lett. 74, 3273 (1995); and T. Miyazaki and N. Tezuka, "*Giant magnetic tunneling effect in Fe/Al$_2$O$_3$/Fe junction*", J. Magn. Magn. Mat. 139, L231 (1995)). Subsequently, S. S. P. Parkin et al. ("*Exchange-biased Magnetic Tunnel Junctions and Application to Non-Volatile Magnetic Random Access Memory*", J. Appl. Phys. 85, 5828 (1999)) obtained effects as large as about 48-50% by optimizing the growth of the $Al_2O_3$ tunnel barrier, by optimizing the interface between the $Al_2O_3$ tunnel barrier and the ferromagnetic electrodes, and by carefully controlling the magnetic orientation of the ferromagnetic moments using concepts of magnetic engineering, in particular, exchange bias (see U.S. Pat. No. 5,650,958 titled "Magnetic tunnel junctions with controlled magnetic response" to W. J. Gallagher et al.) and an anti-parallel coupled pinned ferromagnetic layer (see U.S. Pat. No. 5,841,692 titled "Magnetic tunnel junction device with antiferromagnetically coupled pinned layer" to W. J. Gallagher et al.).

The magnetoresistance of MTJs using aluminum oxide tunneling barriers is limited to about 50% at room temperature (S. S. P. Parkin et al., "*Exchange-biased Magnetic Tunnel Junctions and Application to Non-Volatile Magnetic Random Access Memory*", J. Appl. Phys. 85, 5828 (1999); X.-F. Han et al., "*Fabrication of high-magnetoresistance tunnel junctions using $Co_{75}Fe_{25}$ ferromagnetic electrodes*", Appl. Phys. Lett. 77, 283 (2000)), although there have been reports of TMR values of up to about 58% at room temperature (M. Tsunoda et al., "*60% magnetoresistance at room temperature* in *Co—Fe/Al—O/Co—Fe tunnel junctions oxidized with Kr—O2 plasma"*, Appl. Phys. Lett. 80, 3135 (2002)). The detailed structure and composition of the barrier and particularly the structure and composition of the interfaces between the barrier and the ferromagnetic electrodes clearly influences the magnitude of the TMR (as well as the resistance of the junctions). Usually the $Al_2O_3$ tunnel barrier is formed by first depositing a thin aluminum layer and then oxidizing this layer either by using an oxygen plasma or by oxidation in oxygen or air. Incomplete or under-oxidation of the barrier may lead to "pin-holes" in the barrier which will usually result in a diminishment of the TMR. On the other hand, over-oxidation of the barrier or excess oxygen within the barrier or at the barrier surface will result in oxidation of the ferromagnetic electrodes which also usually results in decreased TMR. There have been a small number of reports of improved TMR by using special methods of forming $Al_2O_3$ tunnel barriers. For example, Tsunoda et al., "*60% magnetoresistance at room temperature in Co—Fe/Al—O/Co—Fe tunnel junctions oxidized with Kr—O2 plasma*", Appl. Phys. Lett. 80, 3135 (2002), assert that it is preferred to oxidize the Al layer by using a plasma formed from an inert gas-oxygen mixture where the inert gas is Kr or He. They argue that this method results in an improved barrier layer, because it has previously been shown that $SiO_2$ gate dielectric layers have improved properties (lower number of interface defect states) when formed by oxidation using inert gas-$O_2$ plasmas.

The tunnel magnetoresistance (TMR) of MTJs is also influenced by the ferromagnetic electrode. For electrodes formed from Ni—Fe, Co—Fe or Ni—Fe—Co alloys, it is now generally agreed that there is a surprisingly weak dependence of TMR on the composition of this alloy (S. S. P. Parkin et al., "*Exchange-biased Magnetic Tunnel Junctions and Application to Non-Volatile Magnetic Random Access Memory*", J. Appl. Phys. 85, 5828 (1999); D. J. Monsma and S. S. P. Parkin, "*Spin polarization of tunneling current from ferromagnet/$Al_2O_3$ interfaces using copper-doped aluminum superconducting films*", Appl. Phys. Lett. 77, 720 (2000)), but that the magnitude of the TMR is strongly influenced by the quality of the interface between the ferromagnetic electrode and the $Al_2O_3$ tunnel barrier. Once the interface structure is optimized, either by optimizing the growth or by post-growth annealing, for sufficiently thick $Al_2O_3$ tunnel barriers which give rise to resistance-area (RA) products exceeding ~100-500 $\Omega\mu m^2$, TMR values between 40 and 50% can be obtained for almost all of these ferromagnetic alloys. As the tunnel barrier thickness and the corresponding RA value are decreased below this value, it is generally found that the maximum TMR which can be obtained is reduced (see U.S. Pat. No. 6,226,160 titled "Small area magnetic tunnel junction devices with low resistance and high magnetoresistance" to W. J. Gallagher and S. S. P. Parkin, which is hereby incorporated by reference).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the variation in resistance of the MTJs from device to device which can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device.

The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

The use of MTJ sensors in magnetic recording read heads has been described in several patents including U.S. Pat. No. 5,729,410 to Fontana and Parkin and U.S. Pat. No. 5,898,548 to Dill et al. The high tunneling magnetoresistance of MTJs makes MTJ sensors attractive candidates for next generation recording read heads beyond current-generation in-plane giant magnetoresistive (GMR) spin-valve sensors, which have limited signal due to the comparatively small values of GMR (~10-15%). However, one problem with the use of MTJs for read head sensors is their high resistance as compared to metallic GMR sensors. Moreover, the perpendicular current geometry in MTJ read heads means that the sensor resistance increases as the area of the device is reduced for higher capacity disk drives. The higher the resistance of the sensor, the higher is the Johnson noise associated with this resistance. Thus the high TMR of the MTJ device is mitigated by higher noise: what is important is the signal to noise ratio (SNR), which needs to be as large as possible. In order for MTJ sensors to be competitive with in-plane GMR spin valve sensors, resistance-area (RA) products as low as a few Ohm-$\mu m^2$ are needed. Most work on MTJs for recording head sensors has focused on tunnel barriers formed from alumina ($Al_2O_3$), which has a large tunnel barrier height. The resistance of an MTJ device increases exponentially with the thickness of the tunnel barrier. Thus, in order to make MTJs with RA values in the range of ~1 Ohm-$\mu m^2$, ultra-thin alumina tunnel barriers are required. However, it is very easy to form pin-holes in alumina barriers having the thickness needed to achieve these RA values. Alternative materials have been proposed that have lower tunnel barrier heights such as $Ga_2O_3$, as described in IBM's U.S. Pat. No. 6,359,289 to Parkin. However, $Ga_2O_3$ exhibits comparatively small TMR values. What is needed are MTJs which have high TMR at RA values lower than what has been achieved with alumina and related barriers. Such MTJ materials are also useful for ultra dense MRAM devices in which the cross-sectional area of the MTJ storage cells is scaled down to very small dimensions, thereby requiring the tunnel barrier to be correspondingly thinner to ensure reasonable resistance values for the MTJ storage cell.

The tunneling current in an MTJ is spin polarized, which means that the electrical current passing from one of the ferromagnetic layers is predominantly composed of electrons of one spin type (spin up or spin down, depending on the orientation of the magnetization of the ferromagnetic layer). The spin polarization P of the current can be inferred from a variety of different measurements. The measurement most relevant to magnetic tunneling is to measure the conductance as a function of bias voltage for junctions formed from a sandwich of the ferromagnetic material of interest and a superconducting counter electrode (R. Meservey and P. M. Tedrow, Phys. Rep. 238, 173 (1994)). These studies show that the spin polarization of the tunnel current measured in this way can be simply related to the TMR close to zero bias voltage as first proposed by Juliere (M. Julliére, Phys. Lett. 54A, 225 (1975)). In such a model P is defined as $(n_\uparrow - n_\downarrow)/(n_\uparrow + n_\downarrow)$, where $n_\uparrow$ and $n_\downarrow$ are the density of spin up and spin down states at the ferromagnet/insulator interface. By assuming that the tunnel current is comprised of two independent majority and minority spin currents and that these currents are related to the respective density of states of the majority and minority carriers in the opposing ferromagnetic electrodes, the TMR can be formulated by the relation $TMR=(R_{AP}-R_P)/R_P=2P_1P_2/(1-P_1P_2)$, where $R_{AP}$ and $R_P$ are the resistance of the MTJ for anti-parallel and parallel orientation of the ferromagnetic electrodes, respectively, and $P_1$ and $P_2$ are the spin polarization values of the two ferromagnetic electrodes. Experimentally, it is clear that the magnitude of the TMR is extremely sensitive to the nature of the interface between the tunneling barrier and the ferromagnetic electrode. By changing the properties of the interface layer, for example, by inserting very thin layers of non-magnetic metals between the ferromagnet and the insulator layers, the TMR can be dramatically altered. Based on such observations, most experimental data on magnetic tunneling have usually been interpreted by assuming that P is largely determined by the electronic structure of the ferromagnetic interface layer essentially independent of the tunnel barrier electronic structure.

Recently, it has been speculated that the electronic structure of the tunnel barrier may play a more important role than previously realized (W. H. Butler, X.-G. Zhang, T. C. Schulthess et al., Phys. Rev. B 63, 054416 (2001); and P. Mavropoulos, N. Papanikolaou, and P. H. Dederichs, Phys. Rev. Lett. 85, 1088 (2000)). In particular, the primary role of the tunnel barrier was previously assumed to be to determine the evanescent decay length of the electronic wave functions into the tunnel barrier region. Butler et al. and Mavropoulos et al. have argued that the evanescent decay length depends on both the momentum of the electrons transverse to the ferromagnet/insulator interface as well as the Bloch symmetry of these wave functions. Butler et al. have especially considered the case of Fe/MgO/Fe, since it has long been recognized that there is an almost perfect lattice match between the simple cubic structure of the MgO insulator and the body-centered cubic (bcc) structure of Fe for the (100) crystallographic orientation if the lattices are rotated by 45 degrees. Butler et al. find that for the (100) orientation there is a very slow decay into the MgO barrier of majority spin electron states with $\Delta_1$ symmetry for small transverse momentum. Thus, for parallel orientation of the ferromagnetic electrodes in an MTJ, these electronic states lead to a very high conductance across the tunnel barrier. Butler et al. calculate that the Fe/MgO/Fe system should exhibit TMR values of hundreds or even thousands of percent. Moreover, Butler et al. calculate that the TMR should have a very strong dependence on MgO tunnel barrier thickness, increasing by orders of magnitude as the MgO thickness is changed by a few atomic layers. Such speculations have led to numerous experimental studies to explore the possibility of high TMR in epitaxial (100) oriented Fe/MgO/Fe tunnel junctions. Note that early work by several groups on MTJs containing polycrystalline MgO tunnel barriers found no evidence for large TMR values.

Some of the first studies of Fe/MgO/Fe MTJs were those by Keavney et al. (D. J. Keavney, E. E. Fullerton, and S. D. Bader, J. Appl. Phys. 81, 795 (1997)) who prepared high quality epitaxial MgO tunnel barriers on Fe single crystal whiskers using molecular beam epitaxy (MBE) growth techniques in which the Fe and MgO layers were deposited by electron beam evaporation. Keavney et al. argued that the MgO incompletely wets the Fe underlayer leading to pin-holes in the MgO layer and, thus, to ferromagnetic coupling of the Fe layers through the MgO layer. The pin-holes through the tunnel barrier electrically shorted the MTJ so that no TMR was observed. These authors concluded that MgO was a very poor choice for a tunneling barrier in MTJs. Later Wulthekel et al. (W. Wulthekel, M. Klaua, D. Ullmann, et al., Appl. Phys. Lett. 78, 509 (2001)) prepared high quality epitaxial MgO tunnel barriers on Fe single-crystal whiskers using both molecular beam epitaxy (MBE) and pulsed laser deposition (PLD) growth techniques. This group concluded, by looking at tunneling through the MgO layer using scanning probe microscopy, that a significant portion of the electrical current tunneled through the MgO layer, although there were some local hot spots. The hot spots correspond to some sort of defect or pin-hole. However, although the crystalline quality of these films was very good, this group found no evidence for significant tunneling magnetoresistance in their samples.

The first report of significant tunneling magnetoresistance through epitaxially grown MgO tunnel barriers was by Bowen et al. (M. Bowen, V. Cros, F. Petroff, et al., Appl. Phys. Lett. 79, 1655 (2001)), who reported 60% TMR but at low temperatures (30K). However, at room temperature this group reported TMR values of only 27%, which is much lower than TMR values that have been obtained with conventional amorphous $Al_2O_3$ tunnel barriers. This group studied sandwiches of CoFe/MgO/Fe grown on GaAs(100) with MgO(100) buffer layers by a combination of sputtering (CoFe and Fe) and laser ablation (MgO). The MgO barrier was grown at 400° C., and the Fe and CoFe layers were deposited at room temperature, but the Fe layer was annealed at 400° C. after deposition and prior to deposition of the MgO layer on top of it. The $Co_{50}Fe_5O$ layer was the top electrode and was presumably used to allow for different magnetic switching fields for the two ferromagnetic electrodes. This group studied TMR in junctions with very thick Fe and CoFe layers (~200 Å and 250 Å, respectively)—much too thick for useful applications because of the very large demagnetizing fields that would be produced by these thick layers. This group explored MgO layers in a range of thickness from 20 to 80 Å, and from cross-section transmission electron microscopy studies found good quality crystalline (100) oriented MgO layers for these thicknesses. Based on the predictions by Butler et al. that the TMR for epitaxial MgO tunnel barriers should increase strongly with MgO thickness, Bowen et al. argued that the small TMR values they observed might be increased for thicker MgO tunnel barriers, although they only included tunneling transport data for one MgO layer thickness.

Popova et al. (E. Popova, J. Faure-Vincent, C. Tiusan, et al., Appl. Phys. Lett. 81, 1035 (2002)) have published results on epitaxial 100 oriented Fe/MgO/Fe/Co MTJs deposited by MBE on MgO(100) substrates. This group prepared the Fe layers by evaporation from a Knudsen cell and the Co and MgO layers by electron beam evaporation. The first Fe layer was deposited at room temperature and then annealed at 450° C. after deposition and prior to deposition of the MgO barrier. This group reported modest values of TMR at room temperature of only ~15% for junctions with 10 Å thick MgO barriers, although the crystalline quality of the structures was very good with smooth and epitaxial Fe and MgO layers. This same group has recently published data on similar structures with thicker tunnel barriers (25 Å thick) in which TMR values of up to 67% were found at room temperature (J. Faure-Vincent, C. Tiusan, E. Jouguelet, et al., Appl. Phys. Lett. 82, 4507 (2003)). They argue that thick MgO tunnel barriers are needed to obtain these higher TMR values, even though the TMR they find is not significantly higher than that which has been observed in MTJs with $Al_2O_3$ tunnel barriers. Popova et al. also suggest that the modest TMR values they find, especially when compared to the theoretical predictions of Butler et al., may result from the formation of an FeO layer at the Fe/MgO interface during the deposition of MgO on the lower Fe electrode. The formation of an FeO layer was previously postulated by Meyerheim et al. (H. L. Meyerheim, R. Popescu, J. Kirschner, et al., Phys. Rev. Lett. 87, 076102 (2001)), who found evidence for a such a layer from detailed structural investigations using surface x-ray diffraction of the growth of MgO on single crystal Fe(001) substrates. Recently, X.-G. Zhang, W. H. Butler, and A. Bandyopadhyay (Phys. Rev. B (2003)) have carried out calculations of the TMR for Fe/FeO/MgO/Fe junctions and have found that the presence of an FeO layer substantially reduces the predicted TMR values for this system.

Recently Mitani et al. (S. Mitani, T. Moriyama, and K. Takanashi, J. Appl. Phys. 93, 8041 (2003)) have also attempted to prepare epitaxial Fe/MgO/Fe tunnel junctions by growth on single crystalline MgO(100) substrates. Mitani et al. first deposited an Fe layer (200 Å thick) by electron beam deposition at room temperature with a subsequent post-deposition anneal at 200° C. They then deposited a MgO tunnel barrier by depositing a thin layer of Mg, plasma oxidizing this layer in an Ar—$O_2$ mixture, and then repeating this process several times to create the tunnel barrier. Subsequently they deposited a $Co_{50}Fe_{50}$ counter electrode on top of the MgO barrier to create the MTJ. Although this group was able to prepare high quality epitaxial tunnel junctions, these junctions showed poor TMR, with TMR values at low temperatures (4.2 K) of only 22.9%. The resistance of the tunnel junctions was found to decrease substantially with temperature, which Mitani et al. argued was due to poor quality MgO tunnel barriers with defects in the barrier, which resulted in hopping conductivity of the tunneling electrons through these defects.

In U.S. Pat. No. 6,392,281, Tsuge discloses a means of forming a magnetic tunnel junction formed from two ferromagnetic layers separated by an oxide tunnel barrier by first depositing the lower ferromagnetic electrode with or without a metal overlayer and then forming an oxide of the metal layer, if present, and the upper portion of the ferromagnetic layer by exposing these layers to ultra-pure oxygen. When the metal layer is not initially present, a metal layer is subsequently formed on top of the ferromagnetic oxide layer and is then subjected to oxidation by pure oxygen gas. Tsuge argues that a subsequent heat treatment will cause oxygen to diffuse from the ferromagnetic oxide layer into the metal oxide, which forms the tunnel barrier, if the heat of formation of the metal oxide is significantly greater than that of the ferromagnetic oxide. However, the devices of Tsuge have considerably lower tunnel magnetoresistance values than those fabricated using other prior art methods of forming the tunnel barrier and magnetic tunnel junction. Evidently, Tsuge does not demonstrate any improvement over the prior art because the heat of formation of the metal oxide versus the formation of the ferromagnetic oxide is not the critical parameter in determining whether oxygen from the ferromagnetic oxide will diffuse away from this layer into the metal oxide layer. Even though the oxygen may be in a lower energy state in the oxide barrier, the metal oxide barrier will be fully oxidized by the process described by Tsuge because of the high heat of formation of the metal layers disclosed therein. Thus, all the oxygen sites in the metal oxide layer will be occupied, which does not allow for the diffusion of oxygen from the ferromagnetic oxide layer. Moreover, the diffusion of oxygen through a ferromagnetic oxide layer is likely to be small, so that the diffusion of oxygen from the ferromagnetic oxide into the metal oxide layer will require extreme conditions of high temperature. In other words, there will be considerable energy barriers to the flow of oxygen from the ferromagnetic oxide layer into the metal oxide layer, even if there are unoccupied oxygen sites in the metal oxide layer, so that oxygen will not diffuse over distances of more than about 1 atomic layer into the metal oxide layer. Thus it is not surprising that the devices formed by Tsuge have very low tunneling magnetoresistance values, because the surface of the ferromagnetic layer will not be free of oxide, in contradiction to the assertions of Tsuge.

In U.S. patent application Ser. No. 10/646,246 to Parkin titled "MgO tunnel barriers and method of formation" and filed Aug. 22, 2003, a method of forming MgO tunnel barriers is described in which magnetic tunnel junctions are prepared with very high tunnel magnetoresistance. However, the band gap of these MgO tunnel barriers may be too high for certain applications.

There is a continuing need for MTJ devices having significantly higher magnetoresistance values than those in the prior art at lower resistance-area product values.

SUMMARY OF THE INVENTION

One aspect of the invention is a first method of forming a magnesium-zinc oxide tunnel barrier. The method includes depositing a metal layer onto a surface of an underlayer, wherein the surface is selected to be substantially free of oxide. (It should be understood that the terms underlayer and overlayer do not necessarily imply any particular orientation with respect to gravity.) Additional metal is then directed towards the metal layer, in the presence of oxygen, to form a magnesium-zinc oxide tunnel barrier in contact with the underlayer, in which the oxygen reacts with the additional metal and the metal layer, and wherein i) at least one of the metal layer and the additional metal includes Zn, and ii) at least one of the metal layer and the additional metal includes Mg. In one implementation of the method, the metal layer includes Mg but substantially no Zn. In another implementation, the metal layer includes Zn but substantially no Mg. In yet another implementation, the metal layer includes both Mg and Zn. In still another implementation, the additional metal includes Mg but substantially no Zn. In another implementation, the additional metal includes Zn but substantially no Mg. In yet another implementation, the additional metal includes both Mg and Zn. In another implementation, the metal layer includes Mg but substantially no Zn, and the additional metal includes Zn but substantially no Mg. Alternatively, the metal layer includes Zn but substantially no Mg, and the additional metal includes Mg but substantially no Zn. In each case, however, a magnesium-zinc tunnel barrier is formed.

In a preferred implementation of the first method, the tunnel barrier is a $[Zn_{1-x}Mg_x]O$ tunnel barrier, in which x represents an atomic percentage in the range of 1 to 99. In another implementation, the tunnel barrier includes a layer of $[Zn_{1-y}Mg_y]O$ and a layer of $[Zn_{1-x}Mg_x]O$, in which x and y represent respective atomic percentages in the ranges of 1 to 99 and 1 to 100, respectively. (While these formulae as written indicate a stoichiometric oxide, the magnesium-zinc oxide tunnel barrier may include additional oxygen or may have a deficiency of oxygen. However, this deviation from the preferred stoichiometric ratio is preferably less than 5%, and more preferably is less than 1%.) The thickness of the metal layer is advantageously selected to be large enough to prevent oxidation of the underlayer but small enough that, upon reaction of the oxygen with the metal layer, substantially all the metal in the metal layer is oxidized. In a preferred implementation, the tunnel barrier is annealed to improve its performance. The metal layer is advantageously deposited in the absence of substantial amounts of reactive oxygen, with the metal layer being oxidized as the tunnel barrier is formed.

In preferred implementations of the first method, a source of material may be provided that acts as a source of both oxygen and the additional metal, e.g., a zinc-magnesium oxide. The oxygen may include ionized oxygen and/or atomic oxygen, and the oxygen may be provided by a rare gas (e.g., argon)-oxygen plasma. The tunnel barrier preferably has a thickness of between 3 and 50 angstroms. The additional metal may be provided by at least one of the following techniques: reactive sputtering, ion-beam sputtering, evaporation, pulsed laser deposition, and molecular beam epitaxy. The metal layer preferably has a thickness of between 3 and 50 angstroms, more preferably between 3 and 20 angstroms, and still more preferably between 4 and 8 angstroms.

In one preferred implementation of the first method, the underlayer includes a semiconductor. The semiconductor may be either in direct contact with or adjacent to the tunnel barrier. The underlayer may advantageously include at least one of GaAs, GaAlAs, InAs, InAlAs, ZnSe, ZnTe, ZnS, Si, Ge, and SiGe.

In another preferred implementation of the first method, the underlayer includes a ferrimagnetic layer, which is preferably in direct contact with the tunnel barrier. The method may further include forming an overlayer on the tunnel barrier, wherein the overlayer includes a ferrimagnetic layer.

In yet another preferred implementation of the first method, the underlayer includes a layer of at least one magnetic material selected from the group consisting of ferromagnetic materials and ferrimagnetic materials. This magnetic layer may be either in direct contact with, or adjacent to, the tunnel barrier. The magnetic layer may be ferromagnetic and include Fe, or alternatively, it may include an alloy of Fe and Co, with the Fe content of the alloy being between 1 and 99 atomic percent. The magnetic layer may be advantageously bcc and substantially (100) oriented.

In still another preferred implementation of the first method, the method further includes forming an overlayer on the tunnel barrier to form a magnetic tunnel junction, in which the overlayer includes a layer of at least one magnetic material selected from the group consisting of ferromagnetic materials and ferrimagnetic materials. The oxygen concentration may be advantageously selected to increase the magnetoresistance of the magnetic tunnel junction. The method preferably further includes annealing the tunnel junction to increase its tunnel magnetoresistance. For example, the tunnel junction may be annealed at a temperature selected to yield a tunnel magnetoresistance of greater than 50% at room temperature, or the tunnel junction may be annealed at a temperature selected to yield a tunnel magnetoresistance of greater than 70% at room temperature. The overlayer and the underlayer may each include ferromagnetic material selected from the group consisting of i) Fe, ii) an alloy of Co and Fe, iii) an alloy of Ni and Fe, and iv) an alloy of Ni and Fe and Co. For example, the overlayer and the underlayer may each include an alloy of Co and Fe, and the Fe content of the alloy may be 10-20 atomic percent. The ferromagnetic material of the underlayer, the ferromagnetic material of the overlayer, and the tunnel barrier may be substantially (100) oriented, and the ferromagnetic material(s) is preferably bcc. In one preferred implementation of the method, at least one of the underlayer and the overlayer includes antiferromagnetic material that is exchange biased with ferromagnetic material of said at least one layer, with the antiferromagnetic material including at least one alloy selected from the group consisting of Ir—Mn and Pt—Mn (in which the alloy is preferably substantially (100) oriented and is either fcc or slightly distorted fcc, i.e., at least substantially fcc). The underlayer may include antiferromagnetic material over at least one layer selected from the group consisting of Ta and TaN. In a preferred implementation, the tunnel barrier is in direct contact with both magnetic material of the underlayer and magnetic material of the overlayer.

In another implementation of the first method, the method further includes forming an overlayer on the tunnel barrier, in which one of the overlayer and the underlayer includes a non-ferromagnetic, non-ferrimagnetic metal layer, and the other of the overlayer and the underlayer includes a layer of magnetic material selected from the group consisting of ferromagnetic materials and ferrimagnetic materials. The method may include constructing a magnetic tunneling transistor that includes the non-ferromagnetic, non-ferrimagnetic metal layer, the tunnel barrier, and the magnetic layer. The non-ferromagnetic, non-ferrimagnetic metal layer may include a metal selected from the group consisting of Cu, W, Al, AlN, Nb, NbN, WTi, Ti, TiN, Ta, and TaN. The magnetic layer may include a ferromagnetic material selected from the group consisting of i) Fe, ii) an alloy of Co and Fe, iii) an alloy of Ni and Fe, and iv) an alloy of Ni and Fe and Co. In a preferred implementation, the magnetic material and the tunnel barrier are substantially (100) oriented, and the magnetic material is bcc.

In still another implementation of the first method, the method further includes forming an overlayer on the tunnel barrier, in which the overlayer and the underlayer comprise respective non-ferromagnetic, non-ferrimagnetic metals. These metals may be selected from the group consisting of Cu, Al, AlN, W, Nb, NbN, Pt, Pd, Ir, $RuO_2$, Ru, and $IrO_2$.

One aspect of the invention is a second method for forming a magnesium-zinc oxide tunnel barrier that includes providing an underlayer having a surface that is substantially free of oxide. The method further includes forming a metal layer on the surface to both protect the underlayer from oxidation and to wet the underlayer, in which the metal layer includes at least one of Mg and Zn. The method further includes directing oxygen and additional metal (in which the additional metal includes at least one of Mg and Zn) onto the metal layer to form a magnesium-zinc oxide tunnel barrier that is in contact with the underlayer. In this method, at least one of the metal layer and the additional layer includes Zn, and at least one of the metal layer and the additional layer includes Mg. In a preferred implementation, the underlayer includes at least one material selected from the group consisting of ferrimagnetic materials and ferromagnetic materials. The tunnel barrier is preferably annealed to improve its performance.

Another aspect of the invention is a third method of forming a magnesium-zinc oxide tunnel barrier. The method includes forming a metal layer of a preselected thickness on a surface of an underlayer to protect the underlayer from oxidation, in which the metal layer includes at least one of Mg and Zn, and then directing oxygen and additional metal that includes at least one of Mg and Zn towards the metal layer, so that the oxygen reacts with the metal layer and the additional metal to form a magnesium-zinc oxide tunnel barrier on the underlayer. In this method, i) the thickness of the metal layer is selected to be small enough that substantially all the metal of the metal layer reacts with oxygen to form part of the tunnel barrier, ii) at least one of the metal layer and the additional metal includes Zn, and iii) at least one of the metal layer and the additional metal includes Mg. The surface is advantageously selected to be substantially free of oxide. This method may further comprise forming an overlayer on the tunnel barrier, in which the overlayer and the underlayer each include respective ferromagnetic layers, thereby forming a magnetic tunnel junction. (Alternatively, one or both of the overlayer and the underlayer may include a ferrimagnetic layer.) The magnetic tunnel junction is preferably annealed to increase its tunnel magnetoresistance.

A first embodiment of the invention is a structure that comprises an underlayer that includes a first magnetic layer of at least one magnetic material selected from the group consisting of ferromagnetic materials and ferrimagnetic materials. The structure further includes a magnesium-zinc oxide tunnel barrier in contact with the underlayer, and further includes an overlayer. The tunnel barrier is in contact with a surface of the overlayer, with the tunnel barrier being sandwiched between the underlayer and the overlayer. In a preferred embodiment, the underlayer has a surface that is substantially free of oxide formed from the underlayer (such as native oxide material), and the magnesium-zinc oxide tunnel barrier is in contact with said surface of the underlayer. Preferably, the surface of the overlayer is substantially free of oxide formed from the overlayer (such as native oxide material). In one embodiment, at least one of the overlayer and the underlayer includes a spacer layer that is in contact with the tunnel barrier, in which the spacer layer does not substantially interfere with the tunneling properties of the tunnel barrier. In yet another embodiment at least one of the underlayer and the overlayer includes a ferrimagnetic material. The tunnel barrier preferably has a thickness of between 3 and 50 angstroms, and may comprise more than one layer. For example, the tunnel barrier may include a layer of $[Zn_{1-y}Mg_y]O$ and a layer of $[Zn_{1-x}Mg_x]O$, in which x and y represent respective atomic percentages in the ranges of 1 to 99 and 1 to 100, respectively, i.e., one of these layers may be substantially pure MgO. Alternatively, x and y may both be in range of 1 to 99.

In a preferred implementation of the first embodiment, the overlayer includes a second magnetic layer of at least one material selected from the group consisting of ferromagnetic materials and ferrimagnetic materials, so that the first magnetic layer, the tunnel barrier, and the second magnetic layer form a magnetic tunnel junction. The overlayer and the underlayer may advantageously include respective ferromagnetic materials that together with the tunnel barrier form a magnetic tunnel junction, in which i) the amount of any oxide separating the tunnel barrier from the ferromagnetic materials is sufficiently low, and ii) the tunnel barrier, the underlayer, and the overlayer are sufficiently free of defects, so that that the tunnel magnetoresistance of the magnetic tunnel junction is greater than 50% (or even 70%) at room temperature.

In yet another preferred implementation of the first embodiment, at least one of the underlayer and the overlayer includes antiferromagnetic material that is exchange biased with the ferromagnetic material of said at least one layer. The antiferromagnetic material may advantageously include at least one alloy selected from the group consisting of Ir—Mn and Pt—Mn, with the alloy being substantially (100) oriented and either fcc or slightly distorted fcc (i.e., at least substantially fcc). In a preferred embodiment, the underlayer includes antiferromagnetic material over at least one layer selected from the group consisting of Ta and TaN. Furthermore, the tunnel barrier may advantageously be in direct contact with the both the ferromagnetic material of the underlayer and the ferromagnetic material of the overlayer. The tunnel barrier preferably has a thickness of between 3 and 50 angstroms.

In another preferred implementation of the first embodiment, the overlayer includes a metallic layer of non-ferromagnetic, non-ferrimagnetic material in contact with the tunnel barrier, so that the metallic layer, the tunnel barrier, and the first magnetic layer form a magnetic tunneling transistor.

In yet another preferred implementation of the first embodiment, the overlayer includes a layer of semiconductor material in contact with the tunnel barrier, so that the semiconductor layer, the tunnel barrier, and the first magnetic layer form a spin injector device.

In still another preferred implementation of the first embodiment, the overlayer includes a layer of non-ferromagnetic, non-ferrimagnetic metal, which may be in direct contact with the tunnel barrier.

A second embodiment of the invention is a structure that includes an underlayer that has a surface that is substantially free of oxide formed from the underlayer (e.g., native oxide). The structure further includes a magnesium-zinc oxide tunnel barrier in contact with the surface of the underlayer, in which the tunnel barrier has a thickness of between 3 and 50 angstroms. The structure also includes an overlayer, in which the tunnel barrier is in contact with a surface of the overlayer, with the tunnel barrier being sandwiched between the underlayer and overlayer. The underlayer and the overlayer may include respective magnetic materials, so that the structure forms a magnetic tunnel junction having a tunnel magnetoresistance of at least 50% at room temperature. Also, at least one of the underlayer and the overlayer may include a semiconductor in proximity with the tunnel barrier, thereby enabling spin-polarized current to pass between the tunnel barrier and the semiconductor.

A third embodiment of the invention is a structure that comprises an underlayer that includes a magnetic layer of at least one magnetic material selected from the group consisting of ferromagnetic materials and ferrimagnetic materials. The structure further includes a magnesium-zinc oxide tunnel barrier in contact with the underlayer and an overlayer. The tunnel barrier is in contact with a surface of the overlayer and is sandwiched between the underlayer and the overlayer. The underlayer, the tunnel barrier, and the overlayer are in proximity with each other, thereby enabling spin-polarized current to pass through the structure. The tunnel barrier may have a composition that is given by $[Zn_{1-x}Mg_x]O$, wherein x represents an atomic percentage in the range of 1 to 99. Also, the tunnel barrier may have a thickness of between 3 and 50 angstroms.

Another aspect of the invention is a fourth method that includes depositing a metal layer onto a surface of an underlayer, in which the surface is selected to be substantially free of oxide. The method further includes directing additional metal towards the metal layer, in the presence of oxygen, to form a magnesium-zinc oxide tunnel barrier in contact with the underlayer, in which the oxygen reacts with the additional metal and the metal layer. At least one of the metal layer and the additional metal includes Zn; at least one of the metal layer and the additional metal includes Mg; the underlayer includes a layer of at least one magnetic material selected from the group consisting of ferromagnetic materials and ferrimagnetic materials; and the magnetic material and the tunnel barrier are in proximity with each other to enable spin-polarized current to pass between them. The tunnel barrier may have a thickness of between 3 and 50 angstroms. The method may further include forming an overlayer on the tunnel barrier to form a magnetic tunnel junction, in which the overlayer includes a layer of at least one magnetic material selected from the group consisting of ferromagnetic materials and ferrimagnetic materials. The method may also include annealing the tunnel junction to improve its tunnel magnetoresistance. The tunnel junction may be annealed at temperature in the range of 180° C. to 400° C., e.g., at a temperature of at least 180° C., at least 220° C., or at least 360° C. to improve its tunnel magnetoresistance.

For several aspects and embodiments of the invention disclosed herein, a magnesium-zinc oxide tunnel barrier is sandwiched between an underlayer and an overlayer, either one or both of which may include one or more layers of a ferromagnetic material, a ferrimagnetic material, and/or a semiconductor. While the magnesium-zinc oxide tunnel barrier is preferably in direct contact with the ferromagnetic material, ferrimagnetic material and/or semiconductor, each of the underlayer and overlayer may optionally include one or more spacer layers which are adjacent to the magnesium-zinc oxide tunnel barrier but which do not significantly affect the tunneling properties of the magnesium-zinc oxide layer, e.g., by not significantly diminishing the spin polarization of electrons tunneling through the magnesium-zinc oxide tunnel barrier.

Performance of the magnesium-zinc oxide tunnel barriers disclosed herein may be improved through annealing, wherein performance refers to various attributes of the magnesium-zinc oxide tunnel barrier or associated device. For example, annealing a magnetic tunnel junction improves, in particular, its magneto-tunneling resistance; annealing a tunnel barrier improves, in particular, its spin polarization; annealing a MIM or a capacitor improves, in particular, its leakage current or barrier height.

For a fuller understanding of the nature and advantages of the present invention, reference should be made to the following detailed description taken together with the accompanying figures.

DESCRIPTION OF THE PREFERRED EMBODIMENTS

Figure 1:
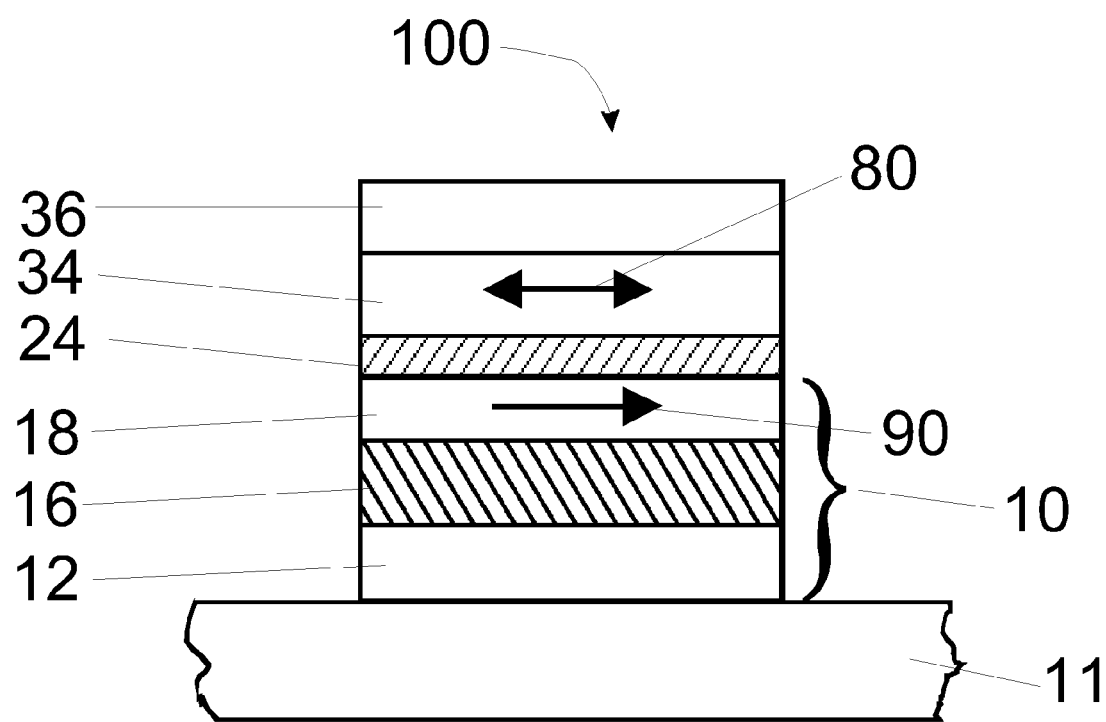
FIG. 1 is a schematic of a magnetic tunnel junction formed in accordance with the prior art.

To date the tunneling barrier that has been most extensively studied for MTJs is alumina ($Al_2O_3$), where the ferromagnetic electrodes are typically formed from various Ni—Fe or Co—Fe or Ni—Co—Fe alloys. While a wide variety of methods have been used to deposit the alumina tunneling barrier, perhaps the most widely used method is one in which a thin layer of metallic Al is first deposited. Subsequently this layer is oxidized, either by "natural oxidation", in which the Al layer is exposed to oxygen or air, or by plasma oxidation, in which the Al layer is placed in an oxygen plasma and the Al layer is often electrically biased by a few volts to enhance the plasma oxidation. The Al layer can also be oxidized by a beam of energetic oxygen ions. For thinner Al layers, it is usually preferred to oxidize the Al layer by natural oxidation.

MgO Tunnel Barriers

In view of this prior art method of forming $Al_2O_3$, the formation of MgO tunneling barriers was extensively studied by first depositing thin Mg layers and then oxidizing the Mg layer either by natural oxidation or by plasma oxidation. Neither of these methods is successful in realizing high quality tunnel barriers. In particular, natural oxidation is ineffective at room temperature. Similarly, under the same conditions in which it is possible to plasma oxidize Al layers with thicknesses ranging from a few angstroms to several tens of angstroms, Mg layers are only poorly oxidized. More aggressive oxidation conditions (e.g., longer oxidation times, higher bias voltages or more intense oxygen plasmas) do not appear to help oxidize the Mg layer. The barriers were usually electrically shorted, as if either an incomplete magnesium oxide layer (if any) was formed, or the MgO layer formed was too thin or not continuous. For example, it is possible that the surface of the Mg layer formed an oxide, which then prevented the Mg layers underneath from oxidizing. Most of these experiments were carried out using shadow masked junctions which requires relatively thick barriers to develop enough resistance across the barrier for reliable measurements of the junction's electrical properties. Limited studies of thinner barriers were carried out using lithographic processing of micron sized junctions to explore much thinner Mg layers. These studies also gave rise to electrically shorted junctions. Thus, it appears that using conventional means to form MgO tunnel barriers do not lead to useful structures.

Following these experiments, studies were carried out in which the MgO tunnel barrier was formed by reactive sputtering of Mg using oxygen or argon-oxygen plasmas onto various ferromagnetic electrodes, including those made of Fe and Co—Fe alloys. These experiments showed that a tunnel barrier could be formed, but that the TMR of the MTJs was always very small or, depending on the ferromagnetic electrode, was negative in sign (i.e., the resistance was higher for the parallel configuration compared to the anti-parallel configuration of the ferromagnetic electrodes). During the process of forming the MgO tunnel barrier, it seemed very likely that the surface of the lower ferromagnetic electrode became oxidized, thereby reducing the TMR when the electrode was formed from Co—Fe or Ni—Fe alloys. Moreover, the resistance of the tunneling barrier was also increased, consistent with the formation of an insulating oxide at the surface of the lower ferromagnetic electrode which increased the effective tunnel barrier thickness.

Figure 2A:
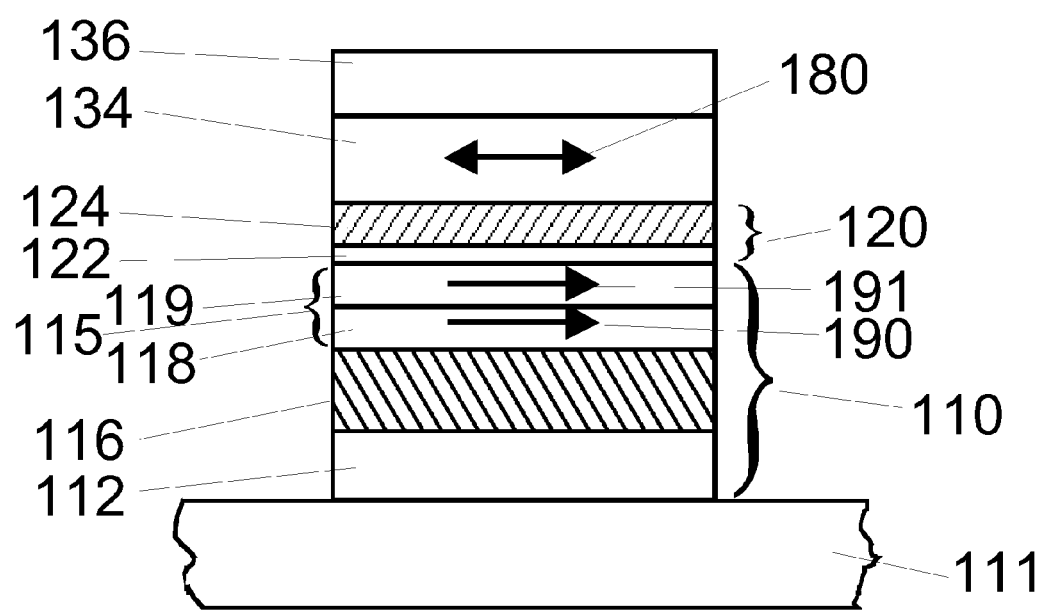
FIG. 2A illustrates the sequence of layers that are deposited to form a MgO or MgZn oxide magnetic tunnel junction.
Figure 2B:
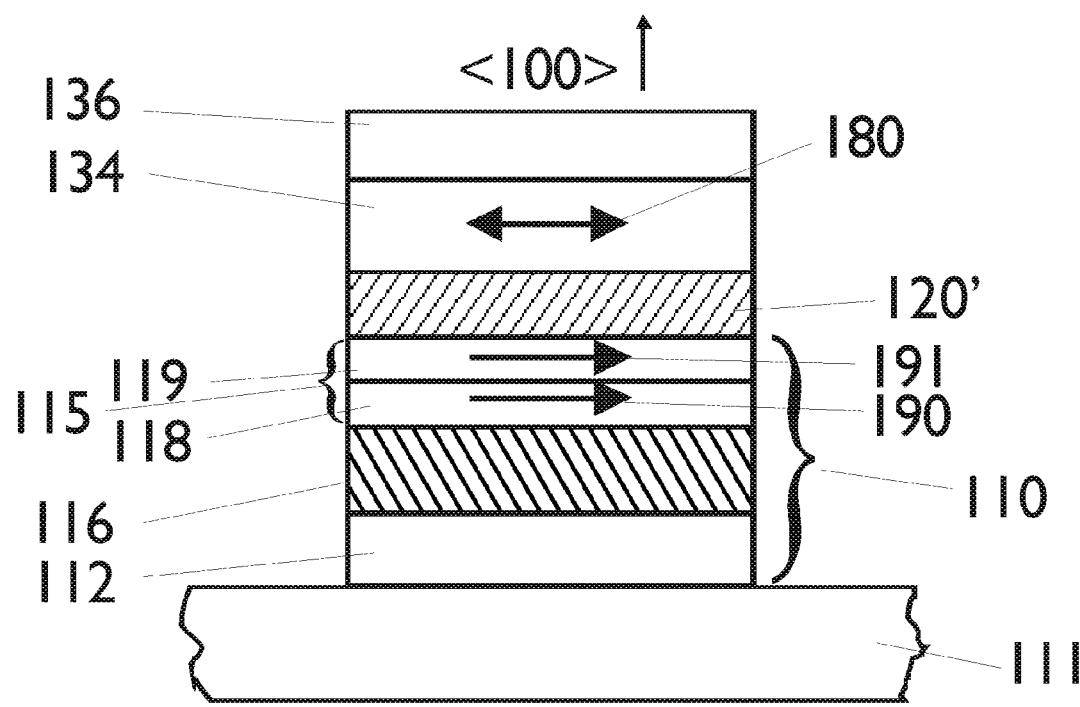
FIG. 2B is a cross sectional view of the MgO or MgZn oxide magnetic tunnel junction that is formed according to the methodology of FIG. 2A.

To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an Ar—$O_2$ plasma. Using this method of preparing the MgO barrier, very high tunneling magnetoresistance values were obtained, much higher than any previously reported values for any MTJ at room temperature. FIG. 2A illustrates this process, in which a tunnel barrier 120 is formed by first depositing a thin Mg layer 122 followed by deposition by reactive sputtering of an MgO layer 124. As shown in FIG. 2B and discussed in more detail below, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. FIG. 2A shows a device that includes a substrate 111, a bottom electrical lead 112, an antiferromagnetic layer 116, a fixed ferromagnetic layer 118, a "free" ferromagnetic layer 134, and a top electrical lead 136, all of which are similar to their counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 118, respectively. As shown in FIGS. 2A and 2B, the fixed ferromagnetic layer may actually be a bilayer 115 of two different ferromagnetic layers 118 and 119, each having a magnetic moment oriented as indicated by the arrows 190 and 191, respectively. The bilayer 115, the antiferromagnetic layer 116, and the bottom lead 112 of FIGS. 2A and 2B constitute a lower electrode 110.

Figure 3:
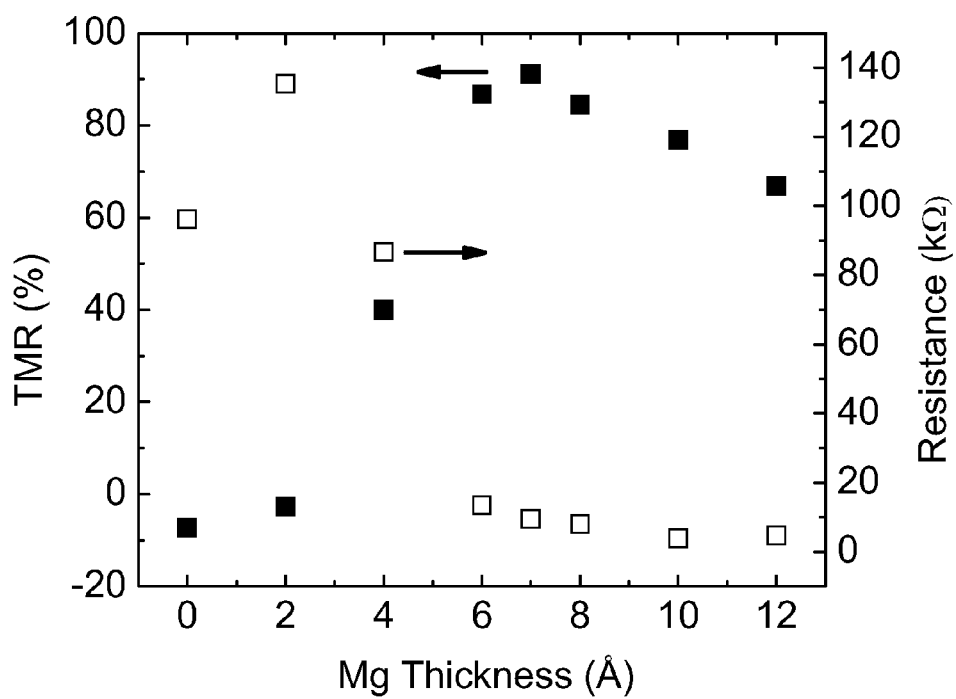
FIG. 3 shows the dependence of tunneling magnetoresistance and resistance on the thickness of a Mg layer used in forming a MgO tunnel barrier of a magnetic tunnel junction.

FIG. 3 shows the detailed dependence of resistance and TMR on the thickness of the Mg layer 122 for a series of otherwise nominally identical MTJs with a structure formed from 75 Å Ta/250 Å $Ir_{26}Mn_{74}$/8 Å $Co_{84}Fe_{16}$/18 Å Fe/t Mg/18 Å MgO/200 Å $Co_{84}Fe_{16}$/100 ÅTa, in which the thickness of the Mg layer t is indicated in angstroms. The MgO layer was formed by reactive sputtering of Mg in a 93% Ar-7% $O_2$ gas mixture. The Mg thickness was varied from 0 to approximately 20 Å (data only shown in FIG. 3 for thicknesses up to 12 Å). As shown in FIG. 3, TMR values of more than 90% are obtained at room temperature for Mg layer thicknesses of ~6 to 7 Å. For Mg layers thicker than this optimal thickness, the TMR decreases slowly for increasing Mg layer thickness, and the resistance of the junction is only weakly dependent on Mg thickness. Below this optimal thickness, the TMR is suppressed and the resistance is much increased by more than an order of magnitude. In the absence of the Mg layer 122, the TMR is small due to oxidation of the Fe underlayer. In order to prevent the oxidation of the Fe surface, it was found that a layer of Mg at least 5 to 6 angstrom thick should be deposited. Presumably, thinner Mg layers do not completely cover or wet the Fe surface, thereby allowing some oxidation of this surface. The dependence of the resistance of the tunnel junction on the Mg metal layer thickness is a very useful criterion for determining the optimum thickness of this layer. The resistance of the junction rapidly increases when this layer is reduced below the optimum thickness, because the lower ferromagnetic electrode becomes oxidized.

The preferred range of thickness of the Mg layer 122 is from about 3 to 20 Å, more preferably from about 3 to 10 Å, and still more preferably from about 4 to 8 Å. The lower thickness is determined by the wetting of the Mg on the ferromagnetic layer 119. If a thinner Mg layer can be formed on this lower ferromagnetic electrode so that it completely covers the ferromagnetic layer with an approximately uniform thickness, then thinner Mg layers can be used. For example, the use of surfactants, such as oxygen, Ag, Pb, Bi, Sb and so on, are known to aid in the formation of ultra thin and smooth metallic layers. Thus, by using a surfactant, thinner Mg layers may be formed which cover completely the lower ferromagnetic layer and, therefore, the minimum thickness of Mg required to prevent oxidation of the lower ferromagnetic electrode is reduced.

As first shown by Parkin (see U.S. Pat. No. 5,764,567) the introduction of thin non-magnetic metallic layers between the ferromagnetic electrodes and the tunneling barrier in MTJs leads to a rapid decrease of the TMR. By contrast, for the case of Mg layers (which are metallic), very high TMR values are observed. The reason is that the Mg layer 122 is oxidized during the subsequent deposition of the MgO layer 124. This is confirmed by cross-section transmission electron microscopy (XTEM) studies, which show no obvious distinction between the Mg layer 122 and the MgO layer 124, so that effectively a single layer of MgO 120' is formed. Moreover, these XTEM studies reveal that the MgO layer 120' that is formed is not only crystalline, but is crystallographically oriented with respect to the lower Fe electrode 118. (By contrast, $Al_2O_3$ tunnel barriers are usually amorphous and without any crystallographically ordered structure except under very special circumstances.) The thickness of the resulting MgO layer 120' is preferably in the range of 3-50 angstroms, more preferably 3-30 angstroms, still more preferably 3-20 angstroms, and most preferably 4-15 angstroms.

The lower ferromagnetic electrode for the samples whose data is shown in FIG. 3 is preferably grown on top of Ta (layer 112) and IrMn (layer 116). The IrMn is an antiferromagnetic layer and is used to exchange bias the lower ferromagnetic electrode. (Alternatively, Pt—Mn may be used.) The preferred composition of the $Ir_xMn_{1-x}$ is when the Ir content is between 10 and 30 atomic percent. This composition range is chosen so that thin films of the Ir—Mn alloy are antiferromagnetic with blocking temperatures well above the operating temperature range of the tunnel junction device. The layer 112 can be formed from Ta or TaN or from Ta layers including lesser amounts of nitrogen. The layer 112 can also be formed from a bilayer of TaN and Ta. Ta, TaN, and a TaN/Ta bilayer are advantageous since layers of IrMn (or PtMn) deposited on top of them are (100) oriented. Similarly, Ti and TiN layers or TiN/Ti bilayers, can also be used to give (100) oriented layers of IrMn (or PtMn). The layer 112 may also incorporate a layer of MgO which typically grows textured in the (100) orientation and so can help improve the (100) texture of the IrMn layer 116.

Growth of IrMn on Ta leads to a (100) growth texture for the face-centered cubic (fcc) IrMn layer. The fcc lattice may be slightly distorted due to in-plane compression or expansion of the fcc lattice. The lower ferromagnetic electrode may be formed from a bilayer 115 of $Co_{84}Fe_{16}$ (layer 118) and Fe (layer 119). The $Co_{84}Fe_{16}$ layer 118 grows (100) oriented on top of the (100) textured IrMn layer 116. Then the Fe layer 119, which is grown on top of the (100) oriented $Co_{84}Fe_{16}$ layer 119, is bcc and also grows (100) oriented. By preparing a (100) oriented bcc template layer of Fe, the MgO deposited on top of this layer also grows (100) oriented. Thus, for this combination of layers, the MgO barrier 120' that is formed also grows textured in the (100) direction, thereby leading to high TMR. By changing the layer 112 or by changing the antiferromagnetic layer 116, the texture of the lower ferromagnetic electrode can be varied. For example, by using Ta/Pt or Ta/Al or Ta/Pd or Ti/Pd as layers 112, the IrMn layer grows textured in the (111) orientation, whereas layers 112 of TaN/Ta, Ta or Ti lead to (100) textured IrMn. The texturing of these layers can be varied by varying their thicknesses or growth temperature. For the samples of FIG. 3, all the layers were deposited at nominally room temperature, although the ambient temperature at the substrate position within the sputter deposition system is typically a little higher than room temperature because of the considerable energy injected into the magnetron plasma sources. Thus, the temperature at the substrates is likely in the range of 40 to 50° C.

By changing the texturing of the IrMn layer 116 from (100) to (111), by changing the layer 112 from, for example, Ti to, for example, a bilayer formed from Ti and Pd layers, the TMR of the resulting MTJ is considerably reduced from values of between ~40 and ~70% to much lower values of between 25 and 35%. These TMR values correspond to the as deposited MTJs. As discussed below, these TMR values can be considerably increased by thermal treatments. Moreover, the TMR of the as-deposited MTJs is likely reduced because the magnetic moment of the pinned layer 118 is not well oriented because the exchange bias provided by the antiferromagnetic layer 116 usually requires a thermal treatment to make it most effective. When the IrMn layer grows in the (111) texture, the $Co_{84}Fe_{16}$ or Fe layers grown on top of the IrMn layer grow bcc but are oriented in the (110) crystallographic direction. The MgO layer also grows in the (110) texture. The different texturing of the MgO layer and the underlying ferromagnetic electrode, whether (100) or (110), which is dependent on the layers onto which the IrMn layer is grown, clearly influences the magnitude of the TMR effect. Thus the (100) texturing of the MgO layer and underlying ferromagnetic electrode can be very important in forming MTJs with high TMR.

It is important that the interface between the underlying ferromagnetic layer 119 and the MgO tunnel barrier 120 is free of ferromagnetic oxide. If the Mg layer 122 is not thick enough or is rough (for example, if the deposition temperature is too high) so that there are thin regions within the Mg layer, then the ferromagnetic layer may become oxidized during the formation of the layer 124. The oxidation of the lower ferromagnetic layer will result in a diminished tunneling magnetoresistance (compared to the case in which the ferromagnetic layer is free of oxide), which cannot be significantly improved by subsequent thermal treatments. Studies were carried out in which, after the ferromagnetic layer 119 is deposited, oxygen is introduced into the deposition chamber. The introduction of oxygen, even at much lower gas pressures than used for the reactive deposition of the MgO layer 124, results in reduced values of tunneling magnetoresistance for Co—Fe and Ni—Fe and Co—Ni—Fe alloys.

Figure 4:
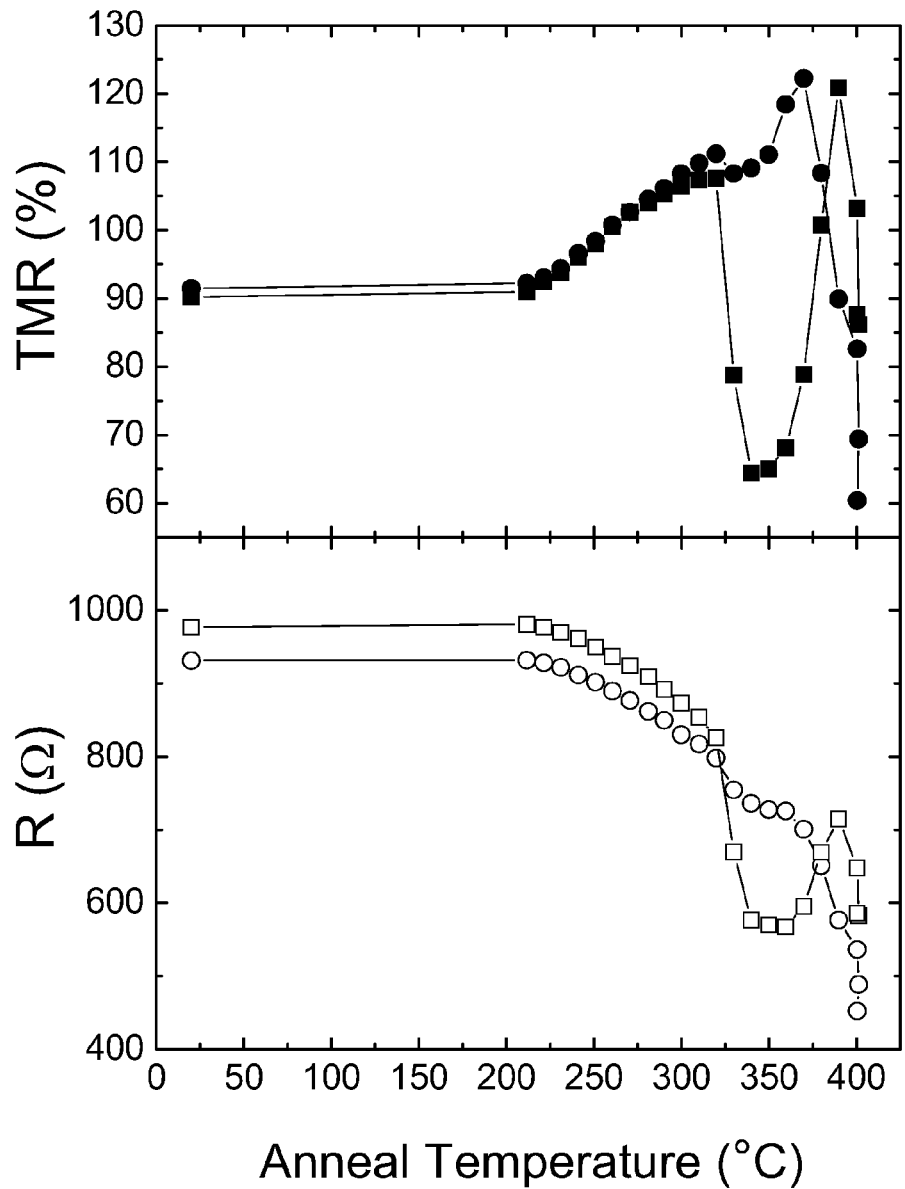
FIG. 4 illustrates how the tunneling magnetoresistance and resistance (measured at 25° C.) vary as a function of annealing temperature for two magnetic tunnel junction devices that include MgO tunnel barriers.

A second advantageous step in obtaining MTJs with high TMR values is to thermally anneal the MTJ after forming the structure shown in FIG. 2B. Typical results are shown in FIG. 4 for an MTJ with a lower electrode 110 formed from TaN (layer 112) 100 Å thick, a 250 Å thick $Ir_{25}Mn_{75}$ layer 116, an 8 Å thick $Co_{84}Fe_{16}$ layer 118, and a 18 Å thick Fe layer 119. The tunnel barrier 120' is formed by depositing a 7 Å thick Mg layer 122 followed by a 16 Å thick MgO layer 124. The MgO layer 124 is formed by reactive sputtering from a metallic Mg target in an argon-oxygen gas mixture. The sputtering gas is predominantly formed from argon, with oxygen being in the range of 1.5 to 9% by volumetric flow of gas at standard temperature and pressure. Thus this corresponds to the relative molecular percentage of the components in the gas mixture. The oxygen partial pressure is kept sufficiently low to prevent "poisoning" of the metallic Mg sputtering target but is sufficient to form a fully oxidized MgO layer. Poisoning of the target can lead to irreproducible deposition rates especially when the same target is used to form both the Mg layer 122 and the MgO layer 124. Conditioning of the target between depositing the Mg and MgO layers is very helpful in obtaining reproducible results. Conditioning may be carried out by pre-sputtering the target either in argon prior to deposition of the Mg layer 122 or in argon-oxygen prior to deposition of the MgO layer 124. The optimum concentration of oxygen in the sputtering gas depends on the detailed geometry and size of the deposition chamber, the pumping speed of the vacuum pumps attached to the system, as well as the power applied to the Mg sputtering source. The deposition rate of the MgO will be influenced by the power applied to the Mg sputter gun as well as the oxygen concentration in the sputter gas, and the sputtering gas pressure, as well as geometric factors such as the distance from the sputter source to the substrate. Typically, it is preferred to use the smallest possible amount of oxygen not only to prevent contamination of the deposition chamber and other sputtering targets in the chamber but also because the thermal stability of the MgO tunnel barrier is influenced by small amounts of excess oxygen in or on top of this layer.

Finally, the ferromagnetic layer 134, which acts as the counter electrode of the MTJ for the samples used in collecting the data shown in FIG. 4, was formed from a 100 Å thick $Co_{84}Fe_{16}$. The capping layer 136 (which acts as the top electrical lead) is formed from a 100 Å thick Ta layer.

FIG. 4 shows TMR data measured on two different shadow masked MTJs at 25° C. after the MTJ has been annealed at a sequence of increasing anneal temperatures. The magneto-transport properties of ten different shadow masked magnetic tunnel junctions on one wafer are first measured at 25° C. The wafer is then heated in the presence of a magnetic field large enough to fully saturate the magnetization of the pinned layer 115 to an anneal temperature $T_A$ and then annealed at this temperature for 15 minutes in the presence of this magnetic field. The sample is subsequently cooled back down to 25° C. in the presence of the same magnetic field. For the data in FIG. 4, a field of 4,000 Oe was used and the sample was annealed in a high-vacuum anneal furnace that has a base pressure of $5 \times 10^{-8}$ Torr. During annealing the pressure is increased in the anneal furnace to $\sim 1 \times 10^{-7}$ Torr due to out-gassing within the furnace. This procedure is repeated for a series of anneal temperatures. FIG. 4 summarizes the magnitude of the tunneling magnetoresistance and the resistance of two different shadow masked tunnel junctions at 25° C. after anneal treatments for anneal temperatures up to 400° C. As shown FIG. 4, the resistances of the two junctions, which have a nominal area of $\sim 100 \times 100$ $(\mu m)^2$, are very similar and decrease slowly with increasing anneal temperatures up to $\sim 320°$ C. Over the same anneal temperature range their TMR values increase steadily up to about 100-110%. As the anneal temperature is increased further, the resistance of one junction continues to decrease slowly and the TMR continues to increase slowly for $T_A$ up to $\sim 370°$ C., where the TMR attains a value of nearly 125%. The second junction also displays a TMR of a similar magnitude after being annealed at 390° C., but at intermediate anneal temperatures both the resistance and TMR are substantially lowered. Surprisingly, at higher anneal temperatures the TMR and resistance recover. The non-monotonic dependence of TMR and resistance on anneal temperature for this second junction suggest that the junction partially breaks down but then remarkably repairs itself with additional annealing at higher temperatures. At anneal temperatures higher than 390° C., the resistance and TMR of both junctions decreases. A sequence of successive anneals was carried out at 400° C. and high TMRs of more than 50% were maintained even after 6 hours of accumulated anneal time at this temperature.

During the deposition of the layer 124, the Mg layer 122 is exposed to oxygen and will become partially or completely oxidized, depending on the oxidation conditions and the thickness of the Mg layer 122. During the thermal anneal treatments the Mg layer may become further oxidized or the texture of this layer or the crystallographic order of this layer may improve. In any case, the layer 122 will essentially be oxidized to form MgO so that the layers 122 and 124 will become largely indistinguishable. This is illustrated in FIG. 2B where layers 122 and 124 are shown as a single layer 120'. Cross-section transmission electron microscopy of a completed MTJ structure confirms that the Mg layer 122 has been substantially converted to MgO, and that this layer is not distinct from the layer 124 either in composition or texture.

Both the free ferromagnetic layer 134 and the pinned lower ferromagnetic layer 115 can be formed from a single layer of homogeneous ferromagnetic material or, alternatively, from two or more layers of different ferromagnetic metals. In the latter case, using a bilayer for the lower ferromagnetic electrode (layers 118 and 119) allows for the independent optimization of the exchange bias field and the magnitude of the tunneling magnetoresistance effect. The MTJ devices used in the collection of the data shown in FIG. 4 have a lower ferromagnetic electrode 115 formed from a bilayer of 8 Å $Co_{84}Fe_{16}$/18 Å Fe. The Co—Fe layer 118 gives a higher exchange bias with the IrMn antiferromagnetic layer than by having Fe directly at the IrMn interface. The Fe layer 119 is used to give higher TMR values in the as-deposited sample although after anneal treatments the magnitude of the TMR is similar for both $Co_{84}Fe_{16}$ and Fe layers at the interface between the layer 115 and the MgO tunnel barrier 120'. However, the lower electrode 115 can also be formed solely from Fe, and high TMR values similar to those shown in FIG. 4 are also obtained (although typically with lower exchange bias fields).

The MTJs in FIG. 4 have a free ferromagnetic layer 134 formed from $Co_{84}Fe_{16}$. Typically, lower TMR values are obtained when the counter electrode 134 is formed solely from Fe or with an Fe layer at the MgO/free ferromagnetic layer interface. Moreover, the thermal stability of such structures is also reduced.

Figure 5:
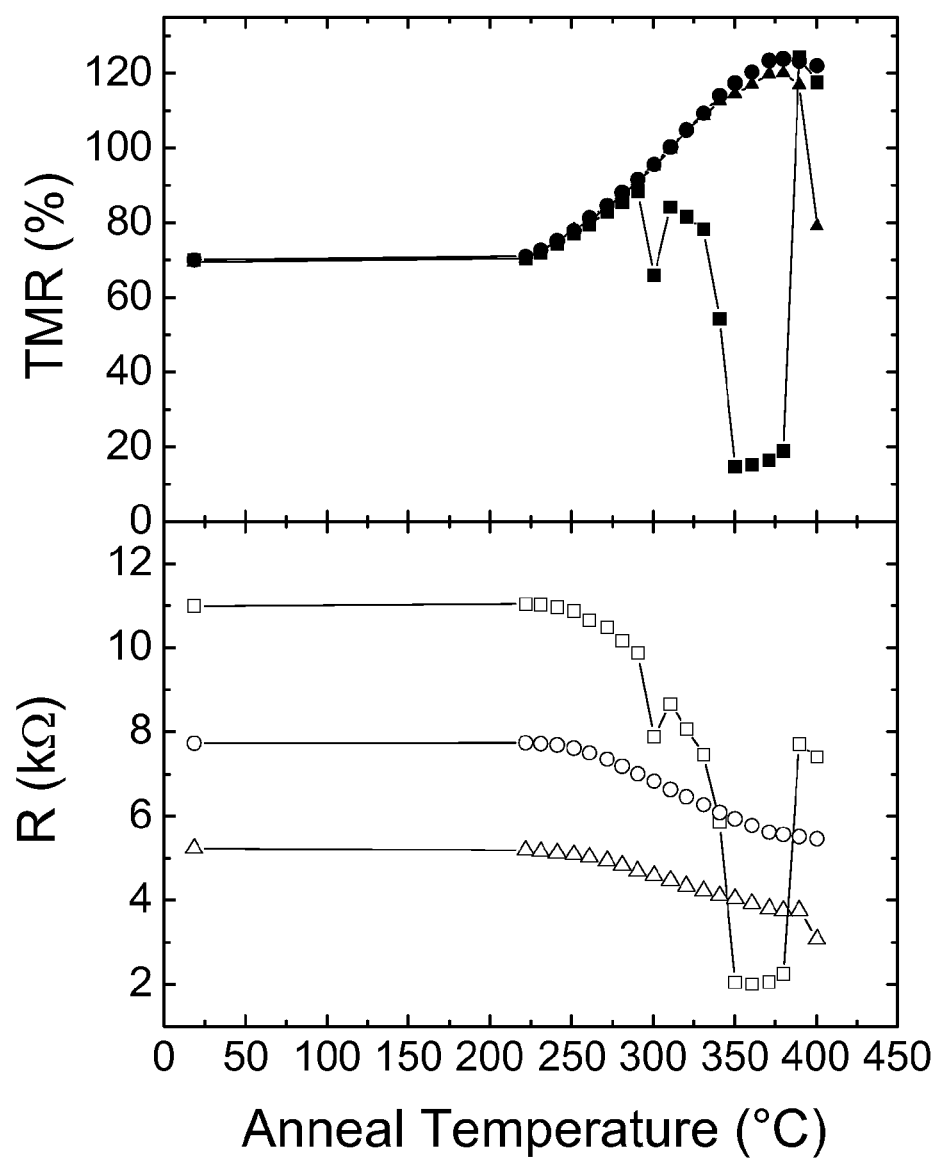
FIG. 5 illustrates how the tunneling magnetoresistance and resistance (measured at 25° C.) vary as a function of annealing temperature for three magnetic tunnel junction devices that include MgO tunnel barriers.

The pinned ferromagnetic layer 115 can be formed from various Co—Fe alloys. In particular, the pinned ferromagnetic layer 115 can be formed from a single layer of Co—Fe without any Fe layers being present. FIG. 5 shows typical TMR and resistance data at 25° C. versus anneal temperatures up to 400° C. for MTJs with $Co_{84}Fe_{16}$ pinned ferromagnetic layers. These MTJs have lower electrodes 110 formed by first depositing layers of 100 Å thick TaN (layer 112) followed by exchange bias layers of 250 Å thick IrMn (layer 116). The pinned ferromagnetic electrode is formed from a single layer of 26 Å $Co_{84}Fe_{16}$ (layer 118; there is no separate layer 119 in this case). The tunnel barrier 120' is formed by first depositing a layer of Mg metal 8 Å thick (layer 122) and an MgO layer by reactive sputtering of Mg in an Ar-5% $O_2$ gas mixture (layer 124). The free ferromagnetic layer is formed from 200 Å $Co_{84}Fe_{16}$ (layer 134) and the capping layer 136 is formed from 100 Å Ta.

Data for three nominally identical shadow masked junctions are shown in FIG. 5. The resistances of the three junctions vary by about a factor of two partly because of variations in the junction areas and partly because of small variations in Mg and MgO thicknesses across the substrates on which the MTJs are formed. Just as for the samples shown in FIG. 4, the TMR increases significantly on annealing. The TMR reaches a value of $\sim 125\%$ at 25° C. following a sequence of anneals at temperatures up to 400° C. Thus, these MTJs display remarkable thermal stability and are much more thermally stable than MTJs formed with prior art MTJs with $Al_2O_3$ tunnel barriers. The thermal stability of these MTJs with $Co_{84}Fe_{16}$ fixed ferromagnetic layers is improved over MTJs with CoFe/Fe fixed ferromagnetic layers. However, just as for the MTJs with CoFe/Fe fixed layers, occasionally the resistances of some of these MTJ devices show non-monotonic variations in resistance and TMR with increasing anneal temperature. This behavior is most likely associated with some sort of defect or defects in the barriers which self-heal in subsequent anneals.

Figure 6:
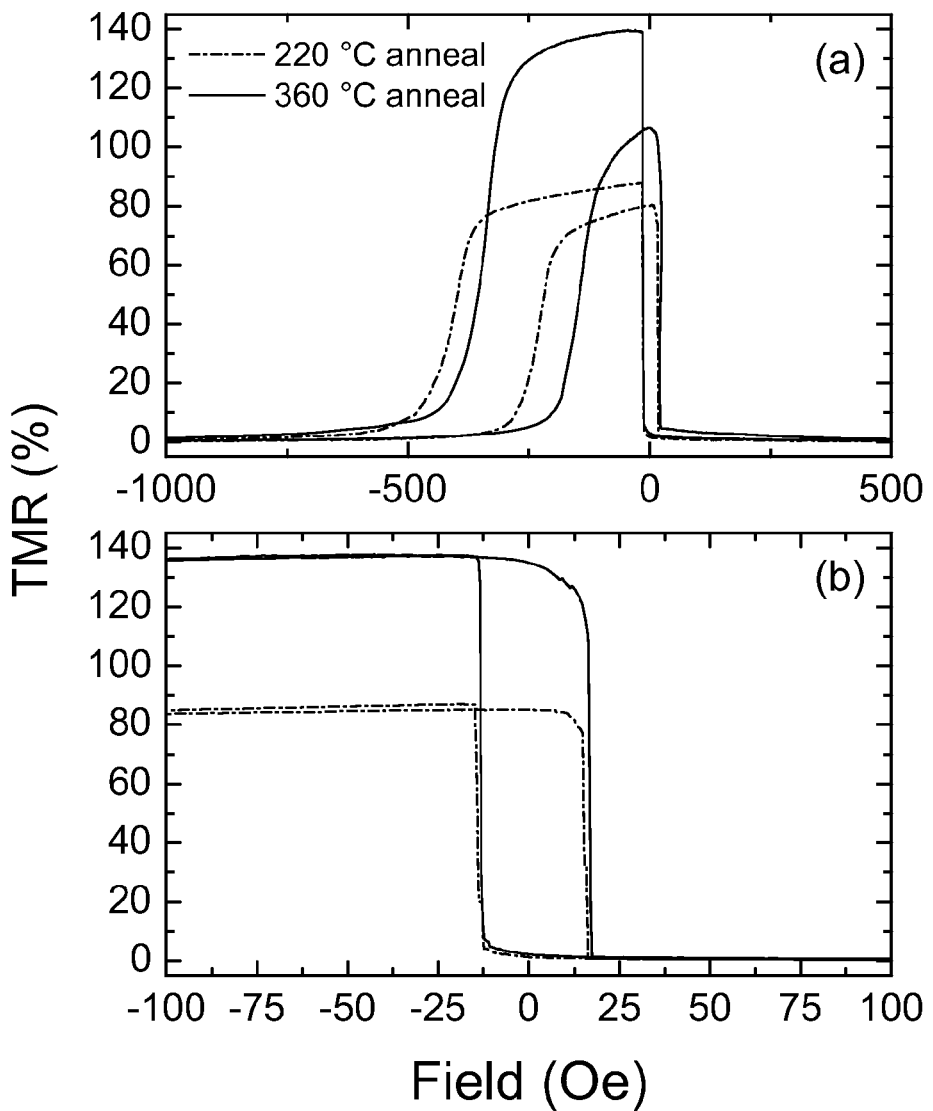
FIG. 6 illustrates how the tunneling magnetoresistance (measured at 25° C.) of a magnetic tunnel junction that includes a MgO tunnel barrier varies as a function of magnetic field in the plane of the device, for final anneal treatments at 220° C. and 360° C.
Figure 7:
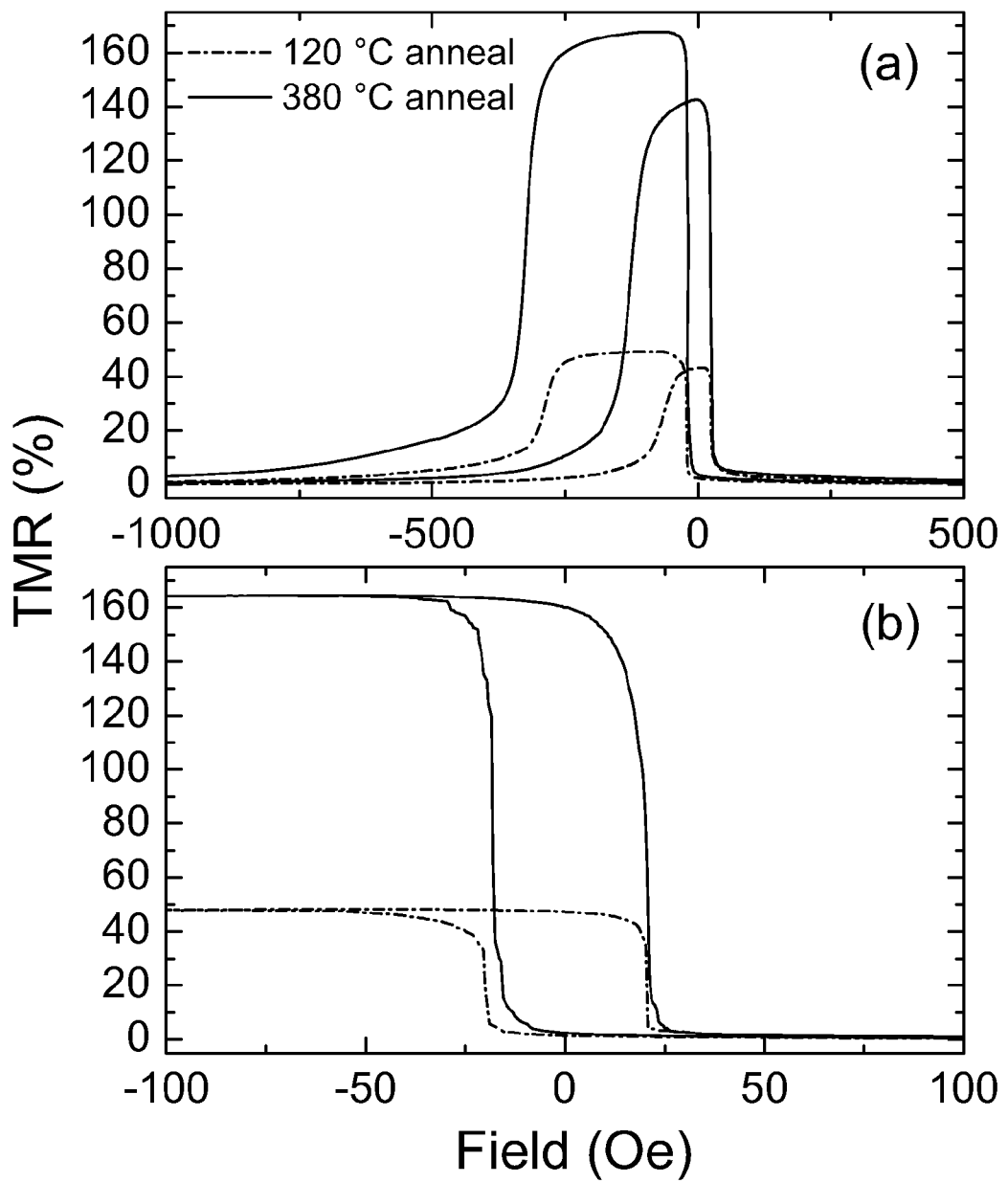
FIG. 7 illustrates how tunneling magnetoresistance (measured at 25° C.) of a magnetic tunnel junction that includes a MgO tunnel barrier varies as a function of magnetic field in the plane of the device, for final anneal treatments at 120° C. and 380° C.

The maximum TMR values obtained after annealing for the data shown in FIGS. 4 and 5 are nearly 125%. By optimizing the structure, growth and annealing conditions TMR values of more than 160% are found at room temperature. In particular, by reducing the thickness of the Mg layer 122, slightly higher TMR values are observed. Resistance versus field curves for typical samples displaying TMR values of more than 140% and 160% are shown in FIGS. 6 and 7, respectively. These TMR values were obtained after annealing these samples to 360 and 380° C., respectively. The higher TMR value for the sample whose data is shown in FIG. 7 is most likely a result of the higher annealing temperature to which it could be subjected, whereas the sample of FIG. 6 degraded significantly when it was annealed above 360° C. Thus, there is some variation from sample to sample in thermal stability. This is most likely because these data are taken on MTJ samples prepared using shadow masks which means that the edges of the samples are exposed to air when removed from the sputter deposition system and during the annealing studies. Since the time between the deposition of these samples and the time when the annealing studies were carried out differs from sample to sample, there is the possibility of different exposures of the edges of the layers in the various MTJs to air and, in particular, to water in the air. MgO is hygroscopic and easily degrades in the presence of water to form a hydroxide which is much less thermally stable. In actual devices the MTJ and the MgO are likely encapsulated by an oxide or other protective material.

Figure 8:
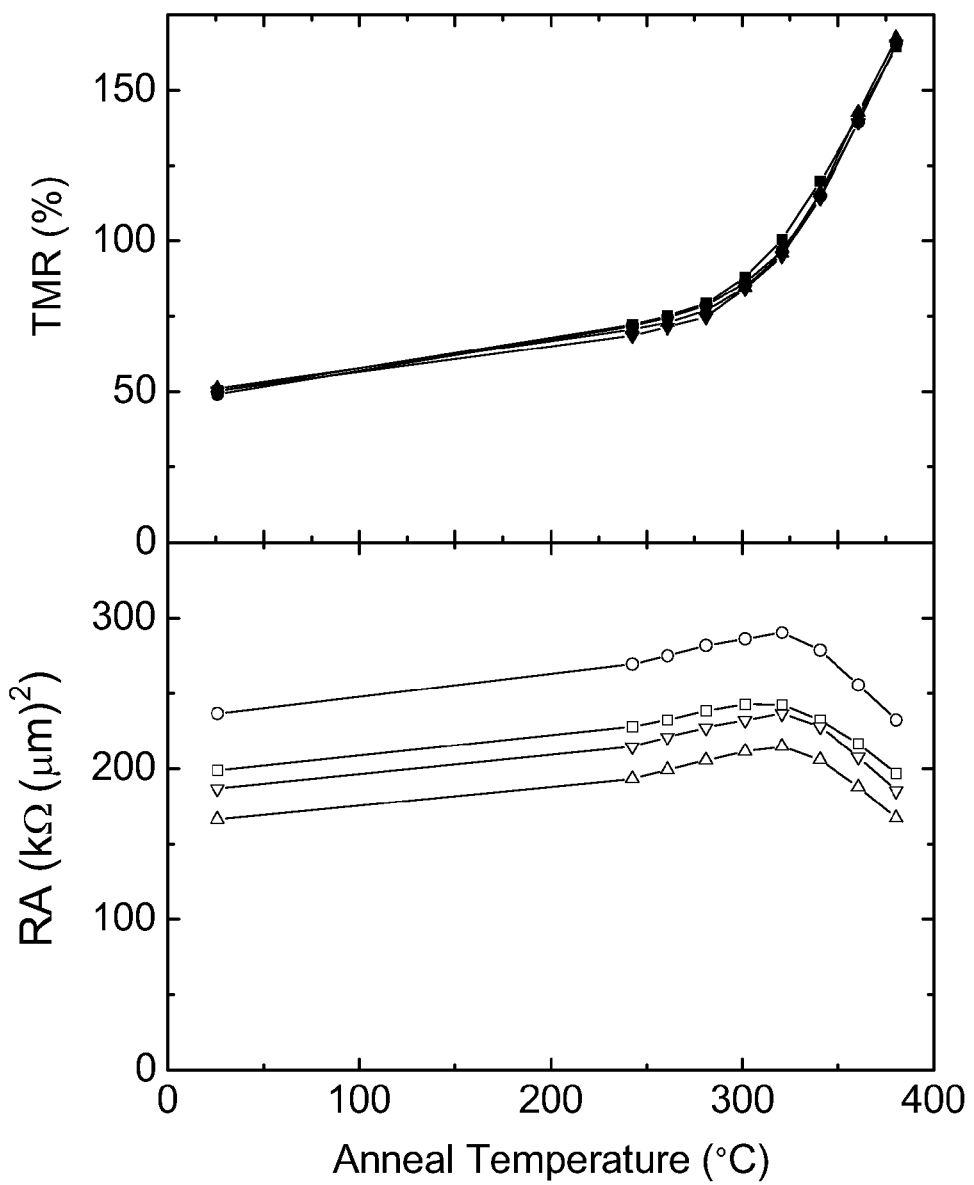
FIG. 8 illustrates how tunneling magnetoresistance and resistance-area product (measured at 25° C.) for three magnetic tunnel junction devices that include a MgO tunnel barrier vary as a function of annealing temperature.

The two samples corresponding to the data in FIGS. 6 and 7 have very similar structures with the exception of slightly different MgO barrier thicknesses. In particular, the layers 112 are formed from 100 Å TaN, in which the Ta was formed by reactive sputtering of Ta in an Ar-2% $N_2$ sputter gas mixture. The nitrogen content was deliberately chosen to be less than the $N_2$ content required to obtain stoichiometric TaN, because N deficient TaN layers can improve the (100) texture of fcc layers grown on top of them. The antiferromagnetic layer 116 was formed from 250 Å $Ir_{25}Mn_{75}$, and the pinned ferromagnetic layer was formed from a bilayer of 8 Å $Co_{84}Fe_{16}$ (layer 118) and 30 Å $Co_{70}Fe_{30}$ (layer 119). The barrier was formed by first depositing a layer of Mg ~5 Å thick (layer 122), followed by a MgO layer (layer 124) formed by reactive sputtering of Mg in an Argon-3% $O_2$ gas mixture. In FIG. 6 the barrier was formed from an MgO layer (124) ~24 Å thick, whereas in FIG. 7 the MgO layer (124) was ~20 Å thick. The resistance-area (RA) product for the sample with the thicker MgO layer ~64 $M\Omega(\mu m)^2$ was correspondingly significantly higher, whereas the RA product for the sample with the thinner MgO layer ~200 $k\Omega(\mu m)^2$ was much lower. Extensive studies were carried out to measure the RA versus Mg layer and MgO thickness. The RA product increases approximately exponentially with the thickness of the MgO tunnel barrier. Notwithstanding the considerable difference in RA values of the two samples of FIGS. 6 and 7, the TMR values and the variation of TMR on annealing is very similar. The detailed dependence of TMR on anneal temperature (for the sample whose resistance versus field curves are shown in FIG. 7) is shown in FIG. 8. The free ferromagnetic layer 134 was formed from 150 Å $Co_{84}Fe_{16}$ in both cases, but the capping layer 136 was formed from 125 Å TaN for the sample with the thicker MgO barrier (FIG. 6) and from 100 Å Mg for the sample with the thinner MgO barrier (FIG. 7). The TaN layer for the capping layer was formed by reactive sputtering of Ta in an Argon-10% $N_2$ mixture, which gives rise to a nearly stoichiometric TaN compound. Studies suggest that such a capping layer has higher thermal stability than layers with lower $N_2$ content.

As shown in FIG. 8, whereas the TMR significantly increases with anneal temperature, the resistance of the MTJ measured when the magnetic moments of the free and pinned ferromagnetic layers are parallel ($R_P$) is comparatively insensitive to anneal temperature, varying by no more than ~30%. The detailed dependence of $R_P$ on anneal temperature is sensitive to the Mg layer thickness, in particular, but is also sensitive to details of the MTJ structure and composition.

Figure 9:
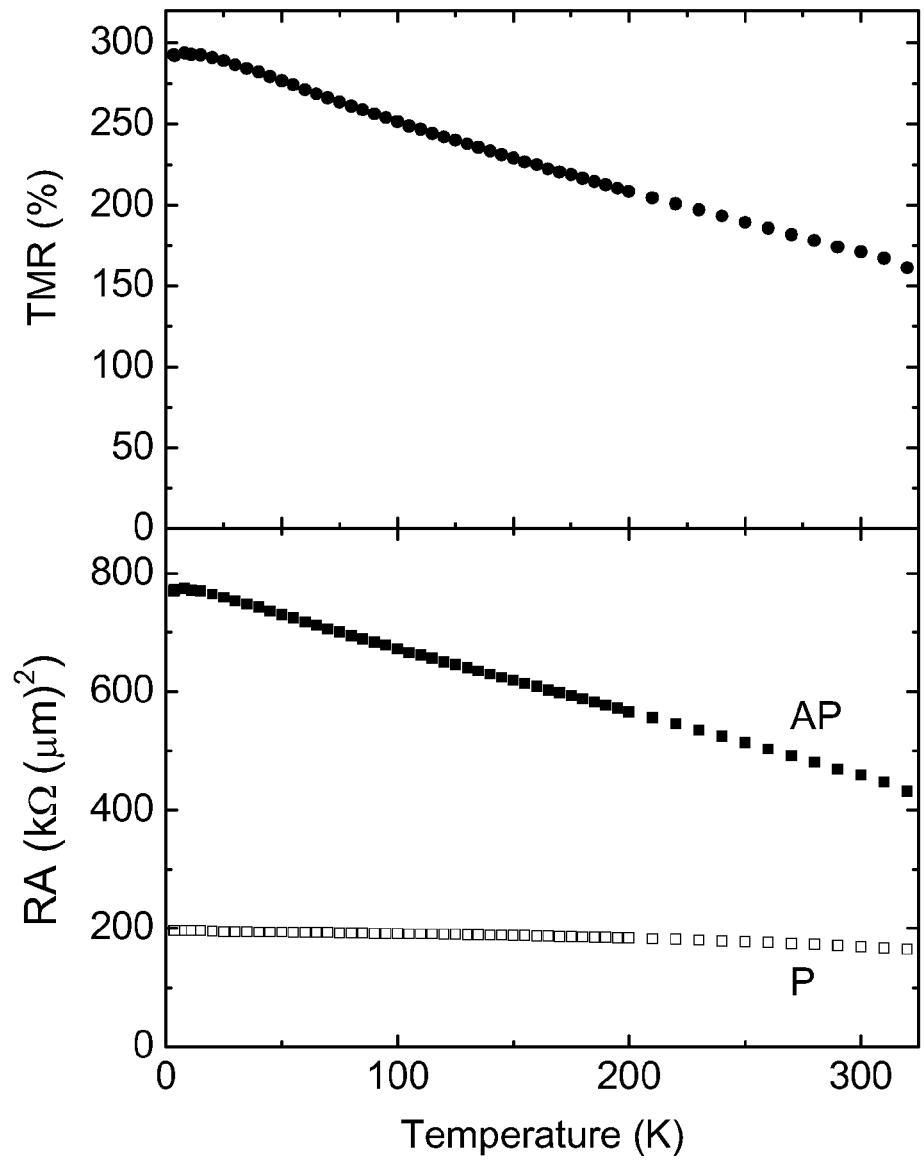
FIG. 9 illustrates how tunneling magnetoresistance and resistance-area product of a magnetic tunnel junction device that includes a MgO tunnel barrier vary as a function of measurement temperature, for both the parallel (P) and antiparallel (AP) orientation of the ferromagnetic layers.

FIG. 9 shows the variation of TMR and resistance-area product with temperature, for temperatures between 325K and 4K, for both the parallel ($R_P$) and anti-parallel ($R_{AP}$) orientations of the free and pinned ferromagnetic layers (for the same sample for which data is shown in FIGS. 7 and 8). As shown in FIG. 9, the TMR increases significantly as the temperature is lowered and almost doubles on cooling from 300K to 4K. Over the same temperature range, the resistance for the parallel state hardly changes at all, but the resistance in the anti-parallel state increases substantially. It is the increase in RAP that largely accounts for the increase in TMR as the temperature is reduced. For similar MTJs with prior art $Al_2O_3$ tunnel barriers, the TMR increases by a factor of about 1.5 over the same temperature range. The increase in TMR is usually attributed to the temperature dependence of the interface magnetization, which is likely to be stronger than that of the bulk magnetization. The larger fractional increase in TMR for MTJs with MgO compared to prior art $Al_2O_3$ tunnel barriers may suggest that the interface magnetization has a stronger temperature dependence for MgO barriers. If this is the case, this would suggest that improved ferromagnetic/MgO interfaces would lead to even higher TMR values at room temperature. It is also possible that the strong temperature dependence of TMR could be attributed to defects in the tunnel barrier which might lead to relaxation of the spin of the tunneling electrons and so to diminished TMR. At lower temperatures, these defect mediated tunneling channels are likely to become less probable which could account for the increased TMR. Finally, the degree of AP alignment of the pinned and free ferromagnetic layer moments also will strongly influence the magnitude of the TMR. The resistance versus field curves do show, as expected, that the exchange bias field does increase significantly as the temperature is reduced from 300 to 4K. Thus a greater degree of AP coupling could also account for the increased TMR values at lower temperatures.

The magnitude of the TMR is most sensitive to the nature of the layer 112. It seems very clear that the layer or layers 112 are preferably chosen so that the IrMn layer and the ferromagnetic pinned layers grow textured in the (100) orientation and that the ferromagnetic layer is preferably formed in the bcc crystal structure. High TMR values (compared to those possible with prior art $Al_2O_3$ tunnel barriers) are found for $Co_{1-x}Fe_x$ alloys with more than about 8 atomic % Fe or for pure Fe underlayers. Ni—Fe alloys which are fcc (e.g. for permalloy, $Ni_{81}Fe_{19}$) give TMR values no higher than those found for prior art $Al_2O_3$ tunnel barriers. The method for forming MgO tunnel barriers described herein can be used for a wide variety of ferromagnetic underlayers and capping layers, with TMR values typically at least as high as those found for prior art $Al_2O_3$ tunnel barriers for otherwise the same structures. However, significantly enhanced TMR values compared to those for prior art $Al_2O_3$ tunnel barriers are found only when the texture of the ferromagnetic layer 119 and that of the MgO tunnel barrier 120' is predominantly (100). There are a wide variety of layers which give rise to (100) texture, and many of these can be used with the method of formation of the MgO tunnel barrier described herein for forming MTJs with increased TMR compared to comparable MTJs with prior art $Al_2O_3$ barriers.

The preferred temperature for annealing MTJs with MgO tunnel barriers formed as described herein depends on the required TMR. The highest TMR values are found for annealing temperatures in the range from 180 to 400° C., with generally higher TMR values, the higher the anneal temperature. For temperatures significantly higher than 400° C., the resistance of the MTJs and the TMR typically decreases. Depending on the application and the environment of the MTJ, the maximum anneal temperature to which the MTJ may be subjected may be limited by other components of the device in which the MTJ forms a part. For applications in magnetic tunnel junction memory elements for use as magnetic random access memories (see, for example, U.S. Pat. No. 6,226,160), the back end of line processing environment may need to withstand temperatures of between 250 and 400° C. The high thermal stability of MTJs described herein makes MTJs with MgO barriers formed as described herein very attractive. For applications as the reading element in magnetic recording heads, the maximum temperature to which the recording head can be subjected during processing may be limited by components of the head other than the MgO tunnel junction read sensor. Thus, it may be preferable to subject the MgO tunnel junction device to an anneal treatment at a preferred temperature after it is formed prior to fabricating other components of the recording head at lower temperatures.

The method of deposition described herein is for deposition at nominally room temperature. However, any of the layer 112, the antiferromagnetic biasing layer 116, the lower ferromagnetic electrode 118 and 119 (if present), the Mg layer 122 and the MgO tunnel barrier 124 may be deposited at elevated temperatures for improving the crystallographic texture of the ferromagnetic layer 119 and the MgO tunnel barrier 120', for the purpose of increasing the TMR magnitude. Preferred deposition temperatures will depend on the detailed structure and composition of these layers. Thermal annealing may also improve the crystallographic texture of the MgO layer 120' and the surrounding layers, so that the structure prior to annealing may not be substantially (100) oriented but after thermal anneal treatments in the temperature range described above the crystallographic texture becomes substantially (100) oriented.

The MgO layer 124 may be formed by various deposition methods in addition to reactive sputter deposition. Any method which delivers both Mg and oxygen in a sufficiently reactive state to form MgO during the deposition of the Mg and oxygen is suitable. For example, the Mg can be deposited by ion beam sputtering from a Mg target in the presence of oxygen generated from a source of atomic oxygen such as an rf or microwave source. Similarly, the MgO can be deposited by ion beam sputtering from a Mg target in the presence of reactive oxygen delivered from an ion-assist source. The MgO layer 124 can also be evaporated from a source of MgO, for example, by electron beam evaporation using a beam neutralizer, or by evaporation from a crucible or from a Knudsen source. The MgO layer 124 can also be formed by deposition from a MgO source in the presence of atomic oxygen provided by an rf or microwave source or any other source of sufficiently reactive oxygen. The MgO layer can also formed by pulsed laser deposition either by using a MgO target or a Mg target in the presence of sufficiently reactive oxygen. The MgO layer may also be formed by reactive sputtering from a Mg target using various sputtering gas mixtures, provided that oxygen is present. For example, Argon can be replaced by other rare gases, for example, Neon or Krypton or Xenon. The Mg in the underlayer 122 and the MgO layer 124 is ideally free of impurities; the Mg preferably contains less than 5 atomic % of impurities, and more preferably less than 1 atomic % of impurities, so as to not substantially affect the tunneling properties of the MgO tunnel barrier, which would, for example, affect the TMR values of the corresponding magnetic tunnel junction.

The ferromagnetic layers herein (such as layers 115, 118, 119, and 134) can be formed from any ferromagnetic or ferrimagnetic metal or indeed any ferromagnetic or ferrimagnetic material which is sufficiently conducting. In particular, these layers can be formed from ferrimagnetic metals such as $Fe_3O_4$, or from metallic ferromagnetic oxides such as oxides from the perovskite family, including the family of ferromagnetic manganites such as $La_{1-x}Sr_xMnO_3$. Likewise, these layers can also be formed from various half-metallic ferromagnetic metals including $CrO_2$, the half-Heusler alloys such as NiMnSb and PtMnSb, and other ferromagnetic Heusler and half-Heusler alloys.

The structure illustrated in FIG. 2B contains an antiferromagnetic layer 116 but MTJs for memory or magnetic field sensing applications can be formed without the layer 116. The moment of the lower ferromagnetic electrode can be fixed by a variety of methods including the use of magnetically hard ferromagnetic materials such as described in U.S. Pat. No. 5,936,293 to Parkin. It is also clear that the exchange biased ferromagnetic electrode can be formed on top of the MgO barrier 120' with the free ferromagnetic layer below the MgO barrier.

It may also be preferred to form one or both of the ferromagnetic electrodes 119 and 134 from sandwiches of two antiferromagnetically coupled ferromagnetic layers for the purposes of reducing the stray magnetostatic fields from the edges of the ferromagnetic electrodes. As described in U.S. Pat. Nos. 5,465,185 to Parkin et al. and 6,153,320 to Parkin, this can be accomplished by forming the electrodes 115 and 134 from sandwiches of two thin ferromagnetic layers separated by thin layers of Ru or Os or an alloy of Ru and Os, in which each of these thin ferromagnetic layers can be formed from a multiplicity of ferromagnetic layers.

Extensive studies were carried out to explore the dependence of TMR on the thickness of the MgO tunnel barrier 120'. High TMR well above 100% was found for a wide range of MgO barrier thicknesses corresponding to RA values ranging from below ~80 $\Omega(\mu m)^2$ to more than $10^9 \Omega(\mu m)^2$. Studies were carried out to determine the lowest possible RA values. The smallest RA values were obtained by depositing the thinnest possible Mg layers 122 and the thinnest possible MgO layers 124. RA values as low as ~1 $\Omega(\mu m)^2$ were obtained for Mg layers in the range of 4 to 5 Å and for MgO layers 124 in the range of 1-4 Å. However, for these ultra-low RA values reduced TMR was observed with TMR values in the range of 25 to 30%. As described in U.S. Pat. No. 6,359,289 to Parkin, magnetic tunnel junction based recording read heads for future generation ultra high density magnetic recording disk drives require extremely low RA tunnel barriers with reasonable TMR values. The method of preparing MgO tunnel barriers 120' described herein may be useful for such applications.

The smallest RA values that can be obtained in devices with reasonable TMR are most likely limited by the structural perfection of the tunnel barrier. Eventually for ultra thin MgO tunnel barriers, it is likely that structural imperfections in the barrier will allow for microscopic conducting paths through the barrier and, thereby, diffusive rather than tunneling current paths through the barrier. The diffusive paths will short out the tunneling paths and lead to reduced TMR. Although ultra thin MgO tunnel barriers can be formed with comparatively low RA values, another means of lowering the resistance of the tunnel junction is to replace MgO with a material with a lower tunnel barrier height. The tunnel barrier height is related to the band gap of the insulating material which forms the tunnel barrier: typically the tunnel barrier height is approximately half of the insulator band gap since the Fermi energy of the metal electrodes will usually be pinned in the middle of the insulator band gap unless there are many defects in the tunnel barrier which might, for example, form an impurity band. At the same time it is important to maintain high TMR values, which means preferably finding a material to replace MgO which has a similar crystalline structure so that the high spin polarization values are preserved.

Figure 12:
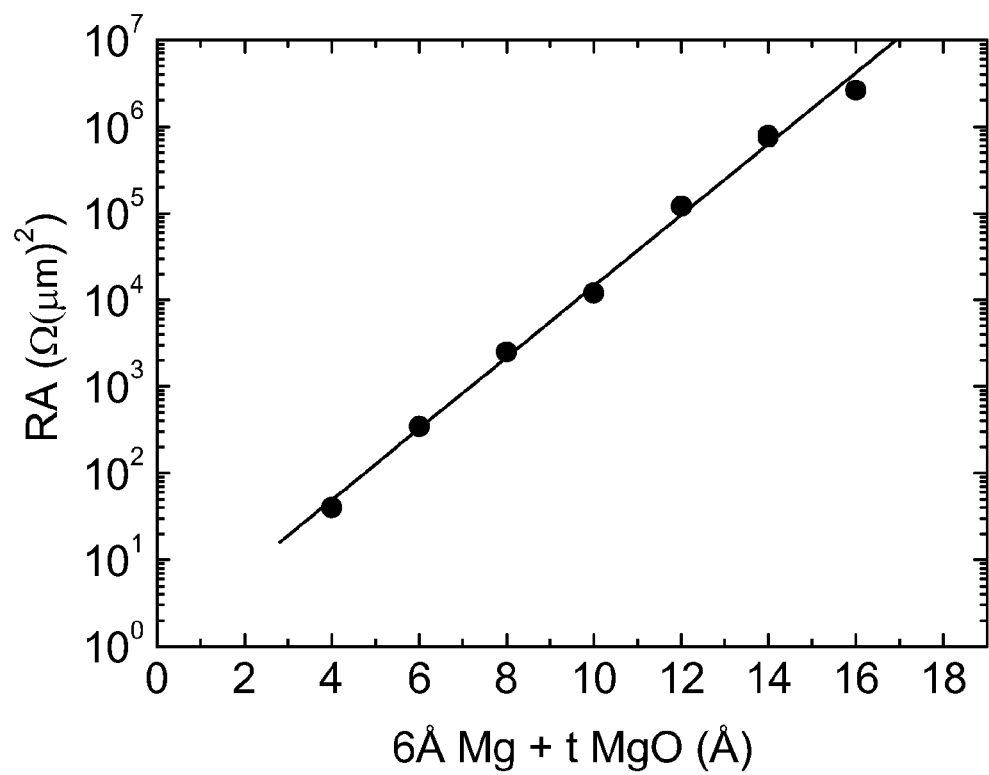
FIG. 12 shows the resistance-area product for a series of otherwise identical MTJs formed with MgO tunnel barriers, in which the thickness of the Mg layer is fixed at ~6 Å and the thickness of the deposited MgO layer is varied from ~4 to 16 Å.

FIG. 12 shows the resistance-area product for a series of otherwise identical MTJs formed with MgO tunnel barriers 120' where the thickness of the layer 122 is fixed at ~6 Å Mg and the thickness of the deposited MgO layer 124 is varied from ~4 to 16 Å. The RA varies from ~$10^7$ to ~1 $\Omega m^2$ for this range of thickness of the MgO layer 124. The TMR values for MTJs with RA values greater than ~100 $\Omega m^2$ were very high and exceeded 100% for annealing at moderate temperatures but for MTJs with lower RA values the TMR was decreased. As can be seen from FIG. 12, very thin Mg layers 122 are needed in order to achieve RA values below ~1 $\Omega m^2$.

Mg—Zn Oxide Tunnel Barriers

The band gap of MgO can be reduced by adding, for example, zinc. The stable phase of ZnO has the wurtzite structure, whereas that of MgO is the cubic rock-salt structure. When Mg is added to ZnO, the ternary Mg—Zn oxide takes up the wurtzite phase for Mg content up to ~37%, whereas when Zn is added to MgO the MgZnO structure maintains the cubic phase for up to ~38% Zn (for example, as presented in Yang et al. Appl. Phys. Lett. 82 3424 (2003)). For intermediate concentrations of Mg and Zn, both the hexagonal wurtzite and cubic rock-salt phases are found. The actual structure exhibited by films of MgZnO will depend in detail on the method of preparation and treatment of these films including the substrate or underlayers on which the film is grown and the temperature at which the film is deposited.

There is much interest in ZnO and MgZnO for opto-electronic applications, for example, for light-emitting diodes or laser diodes in the ultra-violet portion of the electromagnetic spectrum. For these applications the band gap of ZnO has been varied by adding Mg or Cd to increase or reduce the band gap, respectively. For example, Makino et al. (Appl. Phys. Lett. 78, 1237 (2001)) describe the structural and optical properties of $Cd_yZn_{1-y}O$ and $Mg_xZn_{1-x}O$ alloy films prepared by pulsed laser deposition on sapphire substrates. In these experiments the films were found to exhibit the wurtzite phase (rather than the rock-salt structural phase of MgO or CdO) for the range of composition of Cd and Mg doping considered (~7 and ~30%, respectively), and the band gap could be varied from 3 eV (for ~7% Cd) to 4 eV (for ~30% Mg doping). For opto-electronic applications, ZnO and MgZnO films are typically prepared by pulsed laser deposition or by laser molecular beam epitaxy. ZnO films for optoelectronic applications have also been prepared by sputter deposition although there has been little work using this deposition technique. In recent years ZnO films doped with transition metals, for example, Co, Mn and Cr, have been extensively studied using a wide range of deposition techniques in a search for ferromagnetic semiconductors following the theoretical prediction of room temperature ferromagnetism in Mn doped ZnO by Dietl et al. (Science 287, 1019 (2000)). Although there have been several reports of ferromagnetism in doped ZnO, it is often difficult to rule out the possibility of ferromagnetic inclusions, for example, from Co clusters in the case of Co doped ZnO, which might give rise to the measured ferromagnetism.

Figure 10:
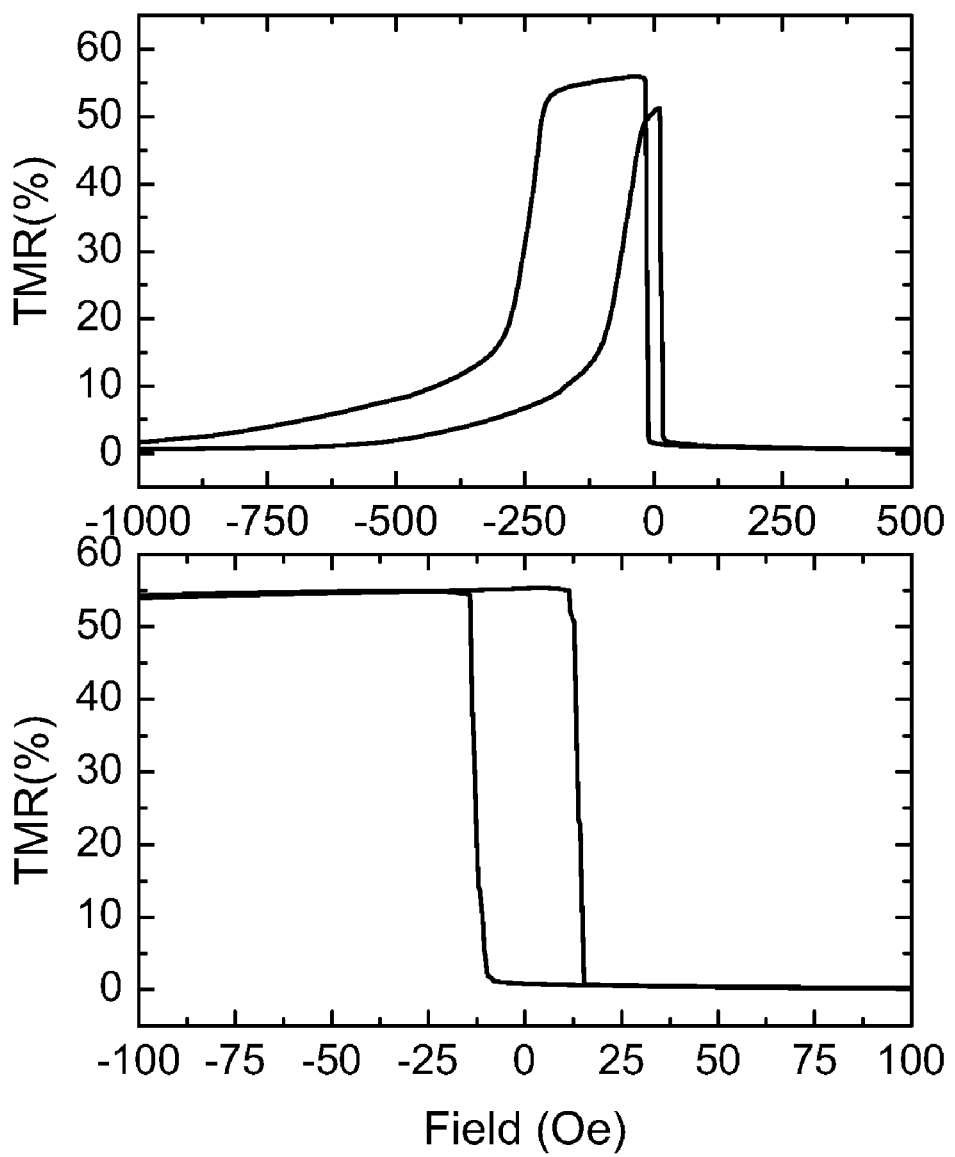
FIG. 10 shows typical resistance versus field plots for an MTJ sample formed with a ZnMgO tunnel barrier according to the present invention.

Although there has been extensive work on the properties of ZnO and MgZnO films for optoelectronic applications, there has been no work on the use of MgZnO for tunnel barriers in magnetic tunnel junctions, although, as discussed above in the background, there has been some prior work on the use of MgO tunnel barriers. This prior art work on MTJs with MgO tunnel barriers has had limited success because of the problems of forming a MgO tunnel barrier without oxidizing the ferromagnetic electrode on which the tunnel barrier was formed. The method of forming an MgO tunnel barrier described herein can be modified to form MgZnO tunnel barriers. FIG. 10 shows typical resistance versus field plots for an MTJ sample formed with a ZnMgO tunnel barrier according to the present invention. The MTJ is grown according to the method of FIG. 2A. In particular the layer 112 was formed from 100 Å TaN, in which the Ta was formed by reactive sputtering of Ta in an Ar-3% $N_2$ sputter gas mixture. The antiferromagnetic layer 116 was formed from 250 Å $Ir_{25}Mn_{75}$ (using a sputter target with a nominal composition of $Ir_{22}Mn_{78}$). The pinned ferromagnetic layer was formed from a bilayer of 8 Å $Co_{84}Fe_{16}$ (layer 118) and 20 Å $Co_{70}Fe_{30}$ (layer 119). The MgZnO barrier was formed by first depositing a metal layer of ~6 Å $Mg_{35}Zn_{65}$ (layer 122) from a Mg—Zn target. The composition of this layer was determined by Rutherford backscattering (RBS) analysis from ~500 Å thick calibration films deposited on Si(100)/250 Å SiO2 and pure graphite substrates in the same deposition sequence without breaking vacuum in the deposition chamber. The compositional accuracy of this technique is ~±0.5 atomic %. A 28 Å thick MgZnO layer 124 was formed on top of the MgZn layer by reactive sputtering from the same MgZn sputtering target used to form layer 122. A sputter gas mixture of Ar-7% $O_2$ was used. The oxygen content of the sputter gas is dependent on the rate at which this layer is formed. The composition of the MgZnO layer 124 was determined by RBS analysis on calibration film samples as $[Mg_{37}Zn_{63}]_{48}O_{52}$. Thus the composition is very close to $[Mg_{1-x}Zn_x]O$ where the MgZn component has ~63% zinc. The upper ferromagnetic electrode 134 was formed from a bilayer of 75 Å $Co_{70}Fe_{30}$ and 125 Å $Co_{84}Fe_{16}$. A final cap layer 136 formed from 100 Å Ta was sputter deposited on top of layer 134. The data shown in FIG. 10 correspond to a junction that was annealed at 260 C after the sample was removed from the deposition chamber.

Figure 11:
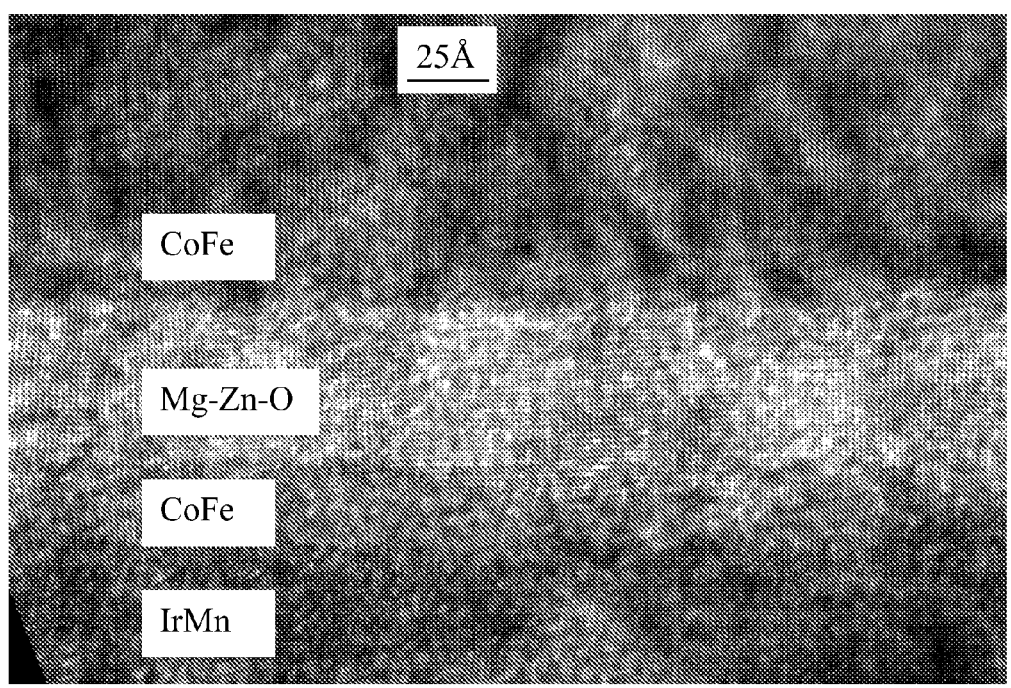
FIG. 11 shows a cross-section transmission electron micrograph (XTEM) of a sample grown in the same deposition run and under the same conditions as those used to form the MTJ sample of FIG. 10.

A cross-section transmission electron micrograph (XTEM) of a sample grown in the same deposition run under the same conditions as that of FIG. 10 is shown in FIG. 11. The sample of FIG. 11 has a structure identical to the one of FIG. 10 except that layer 122 is slightly thinner and is only 5 Å thick, whereas layer 124 is significantly thicker, ~40 Å. This layer was made thicker to facilitate electron microscopy structural studies on this layer. As shown in FIG. 11, the MTJ is highly textured with a 100 texture propagating from the IrMn layer 116 through the lower ferromagnetic electrode 115, through the MgZn oxide barrier 120', and to the upper ferromagnetic electrode 134. The Ta cap layer is not shown in the micrograph. The micrograph clearly shows that the MgZn underlayer 122 is fully oxidized and becomes contiguous with the $[Mg_{1-x}Zn_x]O$ layer 124 so that these layers are no longer distinguishable in the XTEM micrograph and form a single MgZn oxide tunneling barrier layer 120', as shown in FIG. 2B. Interestingly the XTEM micrograph in FIG. 11 shows that the $[Mg_{1-x}Zn_x]O$ layer takes up the cubic rock salt structure even though this layer has a very high Zn concentration (x~0.63). This layer is highly textured and is oriented in the (100) crystal direction. Thus, the same underlayers which give rise to the (100) orientation of MgO tunnel barriers also give rise to a (100) orientation and the cubic phase of $[Mg_{1-x}Zn_x]O$ layers even for high concentrations of zinc. The CoFe layer 119 acts as a template for the growth of the $[Mg_{1-x}Zn_x]O$ layer so stabilizing the cubic structure of $[Mg_{1-x}Zn_x]O$, Selected area diffraction patterns from the XTEM micrograph shown in FIG. 11 show that: the IrMn layer 116 is fcc and has a lattice parameter a=3.84±0.05 Å; that the MgZnO layer 120' is cubic in the rock salt structure with a lattice parameter a=4.28±0.05 Å; and that the upper ferromagnetic CoFe layer CoFe 134 is bcc with a lattice parameter of a=2.88±0.05 Å. All the layers are very well (100) oriented.

The results of FIGS. 10 and 11 show that the method of forming the MgO tunnel barrier described above in connection with FIGS. 2A and 2B can be extended to form tunnel barriers of $Mg_{1-x}Zn_xO$ by i) first depositing, for example, a Mg—Zn layer without any oxygen (so that this Mg—Zn layer covers the underlying ferromagnetic layer), and then ii) depositing, for example, Mg—Zn in the presence of reactive oxygen during which process the previously deposited Mg—Zn layer is oxidized, thereby forming the tunnel barrier.

The Mg—Zn composition of the metal layer 122 does not need to be the same as the Mg—Zn composition of the oxide layer 124. Indeed the layer 122 can be formed from pure Mg and the layer 124 can be formed from pure ZnO. Alternatively, the layer 122 can be formed from pure Mg and the layer 124 from $[Mg_{1-x}Zn_x]O$. Alternatively, the layer 122 can be formed from an alloy with a composition $[Mg_{1-y}Zn_y]$, whereas the layer 124 can be formed by the deposition of a layer of composition $[Mg_{1-z}Zn_z]$ in the presence of reactive oxygen. In general, to form a MgZn oxide tunnel barrier according to preferred implementations of the invention herein, it is only necessary that one of the layers 122 and 124 include Mg and that the other of these layers include Zn.

Figure 2C:
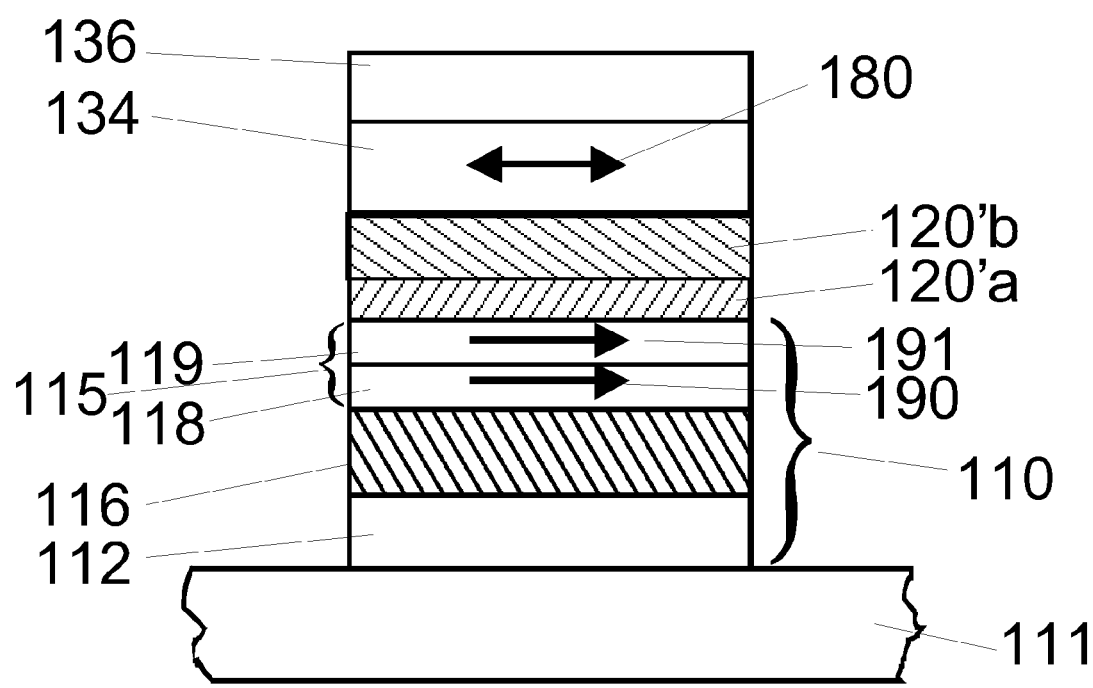
FIG. 2C is a cross sectional view of a magnetic tunnel junction in which a MgZn oxide magnetic tunnel junction includes two distinct layers of tunnel barrier material.

The Zn concentration in the layer 122 can be higher or lower than that of the layer 124. The concentration of Zn in the layer 122 is preferably chosen to optimize the growth of the tunneling barrier 120' as well as for the target RA value. More Zn will lead to an oxide barrier with a reduced tunnel barrier height and so lower RA. Similarly, increasing the concentration of Zn in the oxide layer 124 will also lead to lower tunneling barrier heights and so to lower RA values. For the optimal tunnel barrier with the highest thermal stability it may be preferable to form the layer 122 from an alloy of Mg—Zn with less Zn or even from pure Mg. It may also be preferable to form a tunnel barrier by first depositing a layer of Mg or a Mg—Zn alloy with small amounts of Zn, then by secondly depositing a layer of $[Mg_{1-x}Zn_x]$ in the presence of reactive oxygen (in which this layer contains a higher concentration of Zn), then by thirdly depositing a layer of Mg or $[Mg_{1-x}Zn_x]$ with lower concentrations of Zn in the presence of reactive oxygen. (In this case, Mg—Zn oxide tunnel barriers of two or more layers 120'a and 120'b may be formed, as shown in FIG. 2C. These layers may be of the form $[Zn_{1-x}Mg_x]O$, in which the Mg atomic percentage is between 1 and 100, or between 1 and 99.) In general it may be advantageous to form the tunnel barrier 120' from a first layer of Zn or Mg or Mg—Zn, and then by depositing a sequence of Zn or Mg or Mg—Zn additional layers, in which each of the additional layers is formed in the presence of reactive oxygen. The amount of reactive oxygen may be varied from layer to layer. For example, it may be advantageous to have more oxygen for higher concentrations of Zn. It may also be preferable to have less reactive oxygen in the last additional layer onto which the ferromagnetic electrode 134 is subsequently deposited.

High tunneling magnetoresistance values were found for a wide composition range of the ternary $[Mg_{1-x}Zn_x]O$ oxides. Typically, the TMR values were increased for thermal annealing at moderate temperatures, although the thermal stability was reduced compared to that of zinc-free MgO tunnel barriers. The thermal stability is very sensitive to the oxidation state of the $[Mg_{1-x}Zn_x]O$ layer, so that the properties of the MTJs are strongly dependent on the reactive sputtering conditions under which these oxide layers are formed, especially to the ratio of argon and oxygen in the sputter gas mixture.

In FIG. 12, the resistance-area product is shown for a series of otherwise identical MTJs formed with MgO tunnel barriers 120', in which the thickness of the layer 122 is fixed at ~6 Å Mg and the thickness of the deposited MgO layer 124 is varied from ~4 to 16 Å. Lower RA values can be obtained by using Mg—Zn layers for the layer 122 or by using Mg—Zn oxide layers for 124 or by a combination of these approaches.

Figure 13:
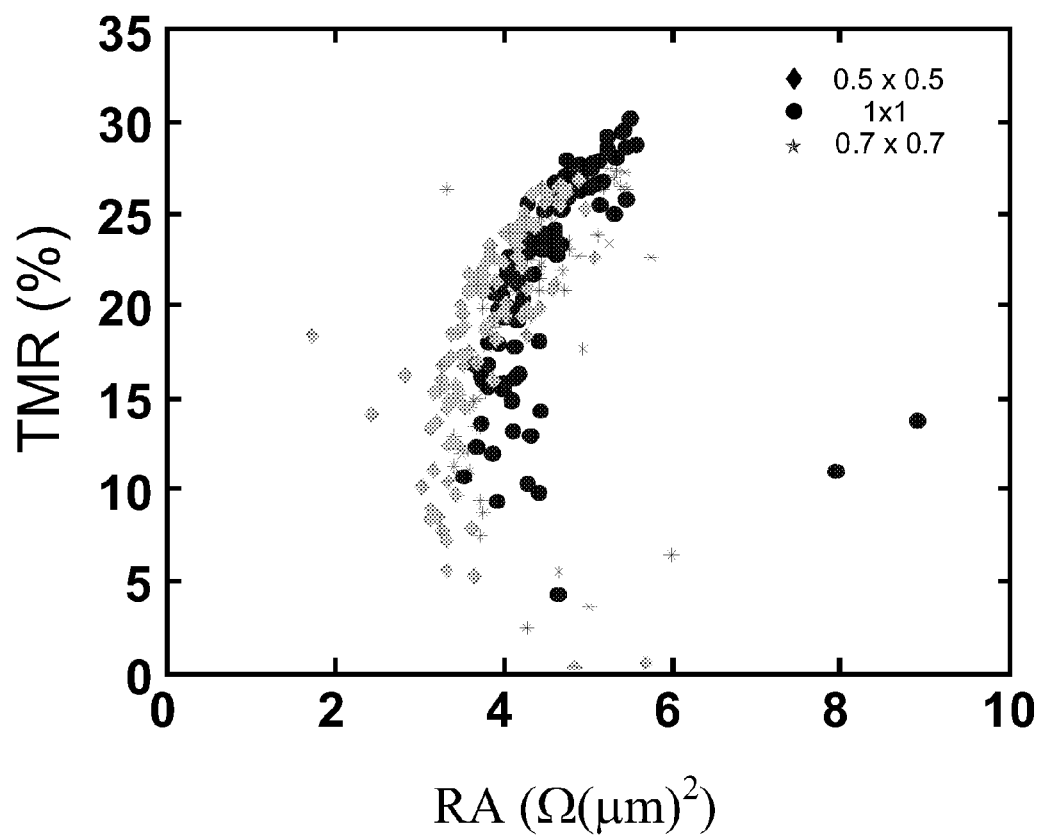
FIG. 13 shows TMR results for samples with structures of the form 100 Å Ta/200 Å Cu/100 Ta/250 Å IrMn/20 Å $Co_{80}Fe_{20}$/7 Å $Mg_{90}Zn_{10}$/~0.5 Å $[Mg_{72}Zn_{28}]_{45}O_{55}$/30 Å $Co_{80}Fe_{20}$/150 Å Ta plotted as a function of the RA values for the same junctions.

Typical TMR results are shown in FIG. 13 for samples with structures of the form 100 Å Ta/200 Å Cu/100 Ta/250 Å IrMn/20 Å $Co_{80}Fe_{20}$/7 Å $Mg_{90}Zn_{10}$/~0.5 Å $[Mg_{72}Zn_{28}]_{45}O_{55}$/30 Å $Co_{80}Fe_{20}$/150 Å Ta plotted as a function of the RA values for the same junction. The samples are prepared on a ceramic substrate formed from the same material typically used to form the slider on which magnetic recording read heads are flown in a hard disk drive. The layer 112 is formed from a tri layer of Ta/Cu/Ta in order to provide a highly electrically conducting electrode. It is important that the resistance of the electrode across the junction width be much less than that of the junction resistance itself in order to prevent current crowding at the contact between the electrode and tunnel junction, which can lead to spuriously high tunneling magnetoresistance signals. Thus to study very low RA tunnel junctions highly conducting electrodes are needed. The layer 122 was formed from a Mg rich alloy of $Mg_{90}Zn_{10}$ and the layer 124 was formed by reactive sputter deposition from a Mg—Zn target using a sputter gas of Ar-9% $O_2$ to give a layer with a composition of $[Mg_{72}Zn_{28}]_{45}O_{55}$. The layer composition was determined by RBS analysis carried out on an 500 Å thick calibration film. This analysis indicated that this film contained excess oxygen which is probably due to the oxygen content of the sputter gas which was higher than that needed for a stoichiometric oxide layer. Since the layer 124 was only 0.5 Å thick for this sample, a slight excess of oxygen in this layer may be preferred to fully oxidize the layer 122.

The results in FIG. 13 show data for three sets of junctions with cross-sectional areas of 1×1, 0.7×0.7 and 0.5×0.05 $\mu m^2$. A small contact resistance (2Ω, in this case) has been subtracted from the data. The data for the three sets of junctions with different areas overlap one another. Although each set of data contains junctions that are nominally identical in area and properties, a considerable spread in values of TMR and RA is found. The variation in properties is presumed to be due to partial electrical shorts in the tunnel devices most likely introduced during the lithographic process of forming the junctions, or otherwise as intrinsic defects in the tunnel barriers formed during the deposition process. The TMR values increase with RA values, and values of TMR of ~30% are found for RA values in the range of ~5 $\Omega m^2$.

Figure 14:
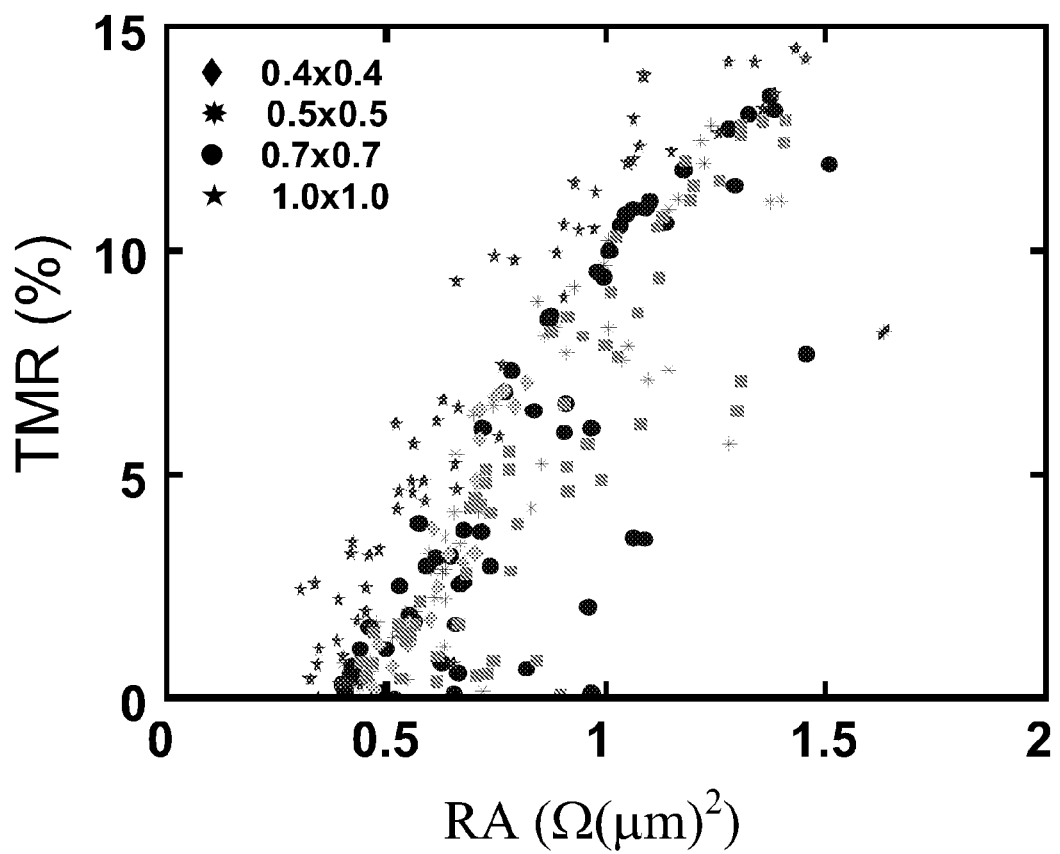
FIG. 14 shows a second set of TMR versus RA data for a sample with the structure of 100 Å Ta/300 Å Cu/150 Ta/250 Å IrMn/20 Å $Co_{84}Fe_{16}$/6 Å $Mg_{79}Zn_{21}$/~0.8 Å $[Mg_{44}Zn_{56}]_{45}O_{55}$/30 Å $Co_{84}Fe_{16}$/150 Å Ta.

A second set of TMR versus RA data is shown in FIG. 14 for a sample with the structure of 100 Å Ta/300 Å Cu/150 Ta/250 Å IrMn/20 Å $Co_{84}Fe_{16}$/6 Å $Mg_{79}Zn_{21}$/~0.8 Å $[Mg_{44}Zn_{56}]_{45}O_{55}$/30 Å $Co_{84}Fe_{16}$/150 Å Ta. The layer 122 is formed from 6 Å $Mg_{79}Zn_{21}$ and the layer 124 from ~0.8 Å $[Mg_{44}Zn_{56}]_{45}O_{55}$. The layer 124 was formed by reactive sputtering of a Mg—Zn target in an Ar-5% O2 sputter gas mixture. When the same target used for forming the layer 124 was used to form a film of Mg—Zn in the absence of oxygen, RBS analysis showed that the composition of this film is $Mg_{61}Zn_{39}$. Thus even if the same MgZn target is used to form both the metal layer 122 and the oxide layer 124, these layers may have different ratios of Mg to Zn, due to the different sputtering yields of Mg and Zn in the presence or absence of oxygen.

FIG. 14 shows TMR data as a function of RA for four sets of nominally identical MTJ devices with respective areas of 0.7×0.7, 0.5×0.5, 0.4×0.4 and 1×1 $\mu m^2$. A small contact resistance (1Ω) has been subtracted from the measured four point resistance of each junction. Higher TMR values at lower RA values are obtained for these junctions as compared to the data in FIG. 13. The lower RA values found can be attributed to the higher amounts of Zn used to form the layers 122 and 124, consistent with the anticipated lower tunnel barrier height for a Mg—Zn oxide barrier with more Zn.

The TMR values of the MTJ devices incorporating Mg—Zn oxide tunnel barriers depend on the Mg—Zn oxide tunnel barrier thickness, thermal treatments of the devices (which can be used to enhance the TMR values), as well as details of the deposition process, especially the amount of reactive oxygen used to form the Mg—Zn oxide layers. The TMR values also are dependent on the structure of the Mg—Zn oxide barrier. It might be contended that the theoretical arguments suggesting improved TMR values in MTJ devices incorporating MgO barriers and Fe electrodes for (100) oriented epitaxially grown devices would also apply for the cubic rock salt structure of MgZnO, so that Mg—Zn oxide barriers, which take up the cubic rock salt structure (especially when grown in conjunction with (100) oriented bcc ferromagnetic electrodes), could give rise to higher TMR values than structures in which the Mg—Zn oxide barrier takes up the Wurtzite structure. On the other hand, these theoretical predictions assumed perfectly formed barriers and interfaces with the ferromagnetic electrodes. This is significant, since other theoretical work suggested that even small amounts of disorder would render the theoretical predictions moot, and indeed, this has been used to explain why other groups have not been able to find TMR values using MgO barriers that are higher than those obtained for more conventional tunnel barriers such as $Al_2O_3$. For example, E.Y. Tsymbal and D. G. Pettifer (Phys. Rev. B 58, 432 (1998)) theorize that disorder in a tunnel barrier leads to a considerable reduction in TMR of MTJs. Similarly, Zwierzycki et al. (Phys. Rev. B 67 092401 (2003)) find that symmetry breaking resulting from disorder at an Fe/InAs interface leads to significantly lower values of the spin polarization of injected current than would otherwise be the case without disorder. The same symmetry arguments should apply to MTJs with MgO or cubic MgZnO tunnel barriers. Thus, it is quite surprising that the TMR values of MTJs using MgO and MgZnO tunnel barriers are so high in the studies disclosed herein, even in view of the novel method of forming these barriers.

Extensive studies were carried out for a range of Mg—Zn compositions of the Mg—Zn underlayer 122 and the Mg—Zn oxide layer or layers 124. The TMR values are typically higher the more Mg there is in the tunnel barrier, exceeding 100% for barriers with lower Zn concentrations. For intermediate Zn concentrations the TMR values exceed 70%, and for Zn rich Mg—Zn compositions, the TMR values exceed 50%—in each case for sufficiently thick Mg—Zn oxide barriers. The reduced TMR values for thinner barriers may be a result of what are commonly termed "pin-holes" in the tunnel barrier, i.e., thinner regions of the tunnel barrier or regions where there may be resistive paths through which electrons might travel by diffusive rather than tunneling transport.

Figure 15A:
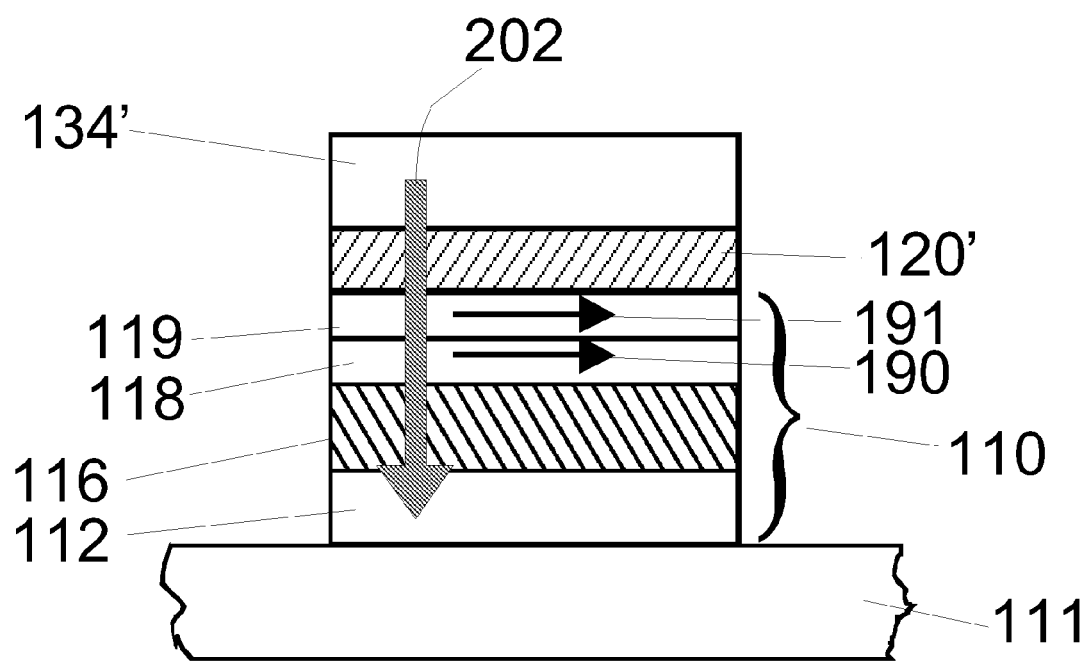
FIGS. 15A, 15B, and 15C are cross sectional views of alternative tunnel junction devices of the present invention that employ MgZn oxide tunnel barriers.

The method of producing high quality $[Mg_{1-x}Zn_x]O$ tunnel barriers without oxidizing the underlayer has been described particularly with reference to the use of such barriers in magnetic tunnel junctions. The method of preparing $[Mg_{1-x}Zn_x]O$ tunnel barriers described herein can be applied to a wide variety of tunnel junction devices in which one or the other or both of the metal layers on either side of the MgO tunnel barrier do not need to be ferromagnetic. Illustrations of such structures are shown in FIG. 15. FIG. 15A shows a tunnel junction device in which the upper electrode is formed from a non-magnetic metal layer 134' adjacent to the $[Mg_{1-x}Zn_x]O$ tunnel barrier 120'. The lower electrode is formed from an exchange biased ferromagnetic layer. (If the layer 134' is of a semiconductor, then the tunnel barrier 120', the lower electrode, and the semiconductor together may form a spin injector device.)

Figure 15B:
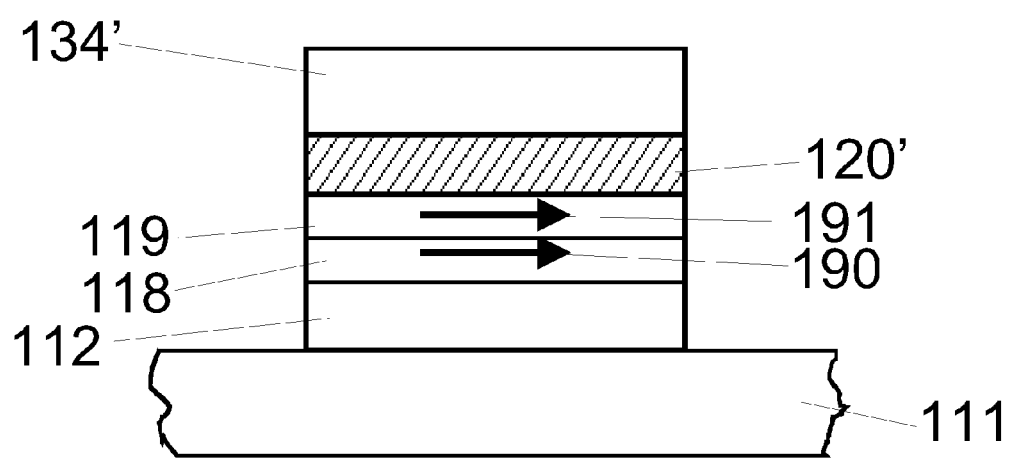

The tunneling current is passed through the device as shown by the arrow 202 and is spin polarized by the ferromagnetic layer 119. FIG. 15B illustrates a similar device in which the lower ferromagnetic electrode is formed without the antiferromagnetic exchange bias layer. Such a structure may be useful as part of a magnetic tunnel transistor (MTT). The MTT is a three terminal device typically formed from a magnetic tunnel junction married to a semiconductor collector where the semiconductor can be formed from, for example, GaAs or Si. The $[Mg_{1-x}Zn_x]O$ tunnel barriers described herein may be grown directly on GaAs or on underlayers that include GaAs. One ferromagnetic electrode in the MTJ forms the emitter, and the other ferromagnetic layer forms the base of the three terminal device between the tunnel barrier of the MTJ and the semiconducting collector. The MTJ component of the MTT could be formed as described herein with a $[Mg_{1-x}Zn_x]O$ tunnel barrier. However, it may also be advantageous for certain applications that the emitter of the magnetic tunnel transistor be formed from a non-magnetic metal according to the structure shown in FIG. 15B.

Figure 15C:
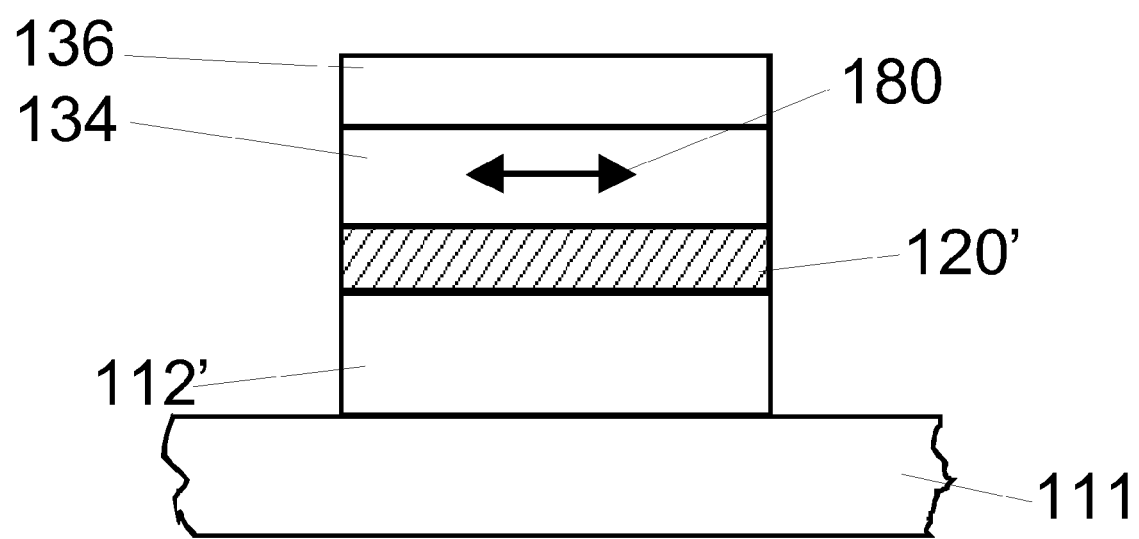

FIG. 15C illustrates a tunnel junction device where the lower electrode is formed from a non-magnetic metal layer 112'. This layer may be formed from more than one metal layer including the possibility that the layer 112' may contain ferromagnetic layers not immediately adjacent to the $[Mg_{1-x}Zn_x]O$ tunnel barrier 120'. Again, this type of structure may be useful as part of an MTT where the emitter of the MTT is ferromagnetic but the base layer is non-magnetic.

For the structures illustrated in FIGS. 15A, B and C, in which there is only one ferromagnetic electrode, the current from the ferromagnetic electrode will nevertheless be spin-polarized.

Figure 15D:
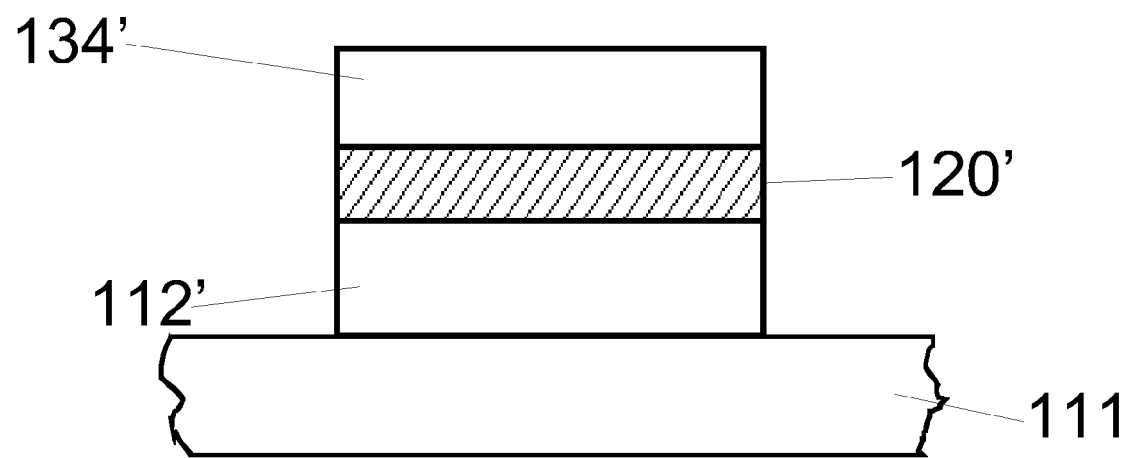
FIG. 15D is a cross sectional view of a metal/insulator/metal device of the present invention that employs a MgZn oxide tunnel barrier.

FIG. 15D shows an example of a metal-insulator-metal (MIM) tunnel junction device. As illustrated in FIG. 15D, the MIM structure contains no ferromagnetic metals on either side of the tunnel barrier. The electrodes 112' and 134' may be formed from one or more metal layers. MIM structures have many applications, for example, capacitors for storing charge or as non-linear elements in electrical circuits. MIM devices may be used as voltage controlled switches if they are sufficiently non-linear. For example, at low voltage the resistance is high but at higher voltages the resistance is substantially reduced because of the non-linear characteristics of the tunnel barrier. The metal layers 112' and 134' can be formed from metals such as Cu, Al, W, W—Ti, $RuO_2$ or $IrO_2$ or Ir, Pt or Pd, as well as TaN, Ta, TiN or Ti. The structure illustrated in FIG. 15D may be useful for superconducting devices in which one or both of the electrodes 112' and 134' may be formed from superconducting layers. For example, one or both of these layers could be formed from Nb or NbN.

Figure 16:
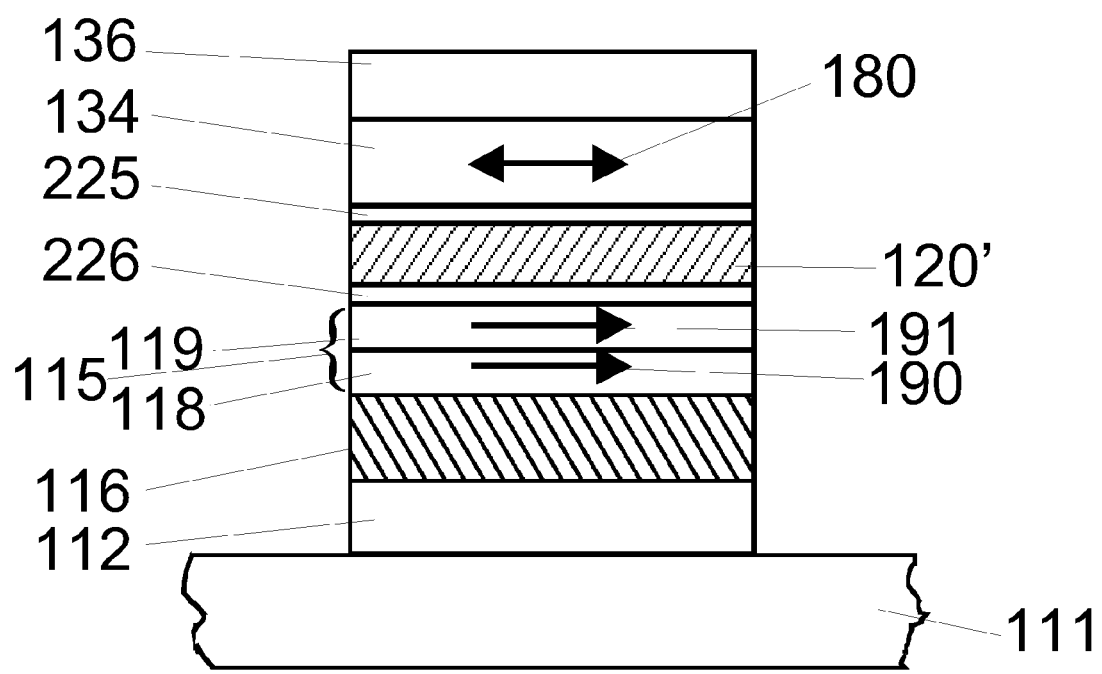
FIG. 16 is a cross sectional view of a magnetic tunnel junction device of the present invention that employs spacer layers.

While the ferromagnetic layer is preferably in direct contact with the $[Mg_{1-x}Zn_x]O$ tunnel barrier 120', it is also possible to separate the ferromagnetic electrode and the tunnel barrier by a thin spacer layer, providing that the spacer layer does not significantly diminish the spin polarization of the electrons tunneling through the tunnel barrier 120'. FIG. 16 illustrates a thin spacer layer 225 between the tunnel barrier 120' and the free ferromagnetic layer 134 in the magnetic tunnel junction device of FIG. 2B. As described in U.S. Pat. No. 5,764,567 to Parkin with reference to magnetic tunnel junction devices formed with alumina tunnel barriers, the ferromagnetic electrodes in such MTJs can be separated from the tunnel barrier by thin spacer layers formed from Cu and other non-magnetic metallic materials while maintaining significant tunneling magnetoresistance. The types of non-magnetic metallic materials which are preferred are those which display large values of giant magnetoresistance in metallic spin-valve structures or in metallic magnetic multilayers. These include Ag and Au as well as Cu. The non-magnetic spacer layer could also be formed from a metallic oxide layer such as $RuO_2$ or a Sr—Ru oxide. As illustrated in FIG. 16, the free ferromagnetic layer 134 and the spacer layer 225 comprise an overlayer. Generally, the magnetic tunnel junction will include an overlayer formed on top of the $[Mg_{1-x}Zn_x]O$ tunnel barrier 120' which may be comprised of one or more ferromagnetic layers with or without a non-magnetic spacer layer, or, more generally, from a multiplicity of ferromagnetic and non-ferromagnetic, non-ferrimagnetic layers. Similarly, the magnetic tunnel junction will include an underlayer beneath the $[Mg_{1-x}Zn_x]O$ tunnel barrier 120' which may be comprised of one or more ferromagnetic layers with or without a non-magnetic spacer layer (e.g., spacer layer 226), or, more generally, from a multiplicity of ferromagnetic and non-ferromagnetic, non-ferrimagnetic layers.

While the method of forming an improved $[Mg_{1-x}Zn_x]O$ tunnel barrier has been described with respect to the formation of $[Mg_{1-x}Zn_x]O$ barriers on polycrystalline underlayers, the method can also be used for the formation of improved $[Mg_{1-x}Zn_x]O$ tunnel barriers on a wide variety of underlayers ranging from crystalline layers prepared on crystalline substrates (such as various facets of $[Mg_{1-x}Zn_x]O$ or sapphire single crystals) to amorphous underlayers (such as CoFeB).

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A structure, comprising:
   a first magnetic layer including at least one material selected from the group consisting of ferromagnetic materials and ferrimagnetic materials;
   a magnesium-zinc oxide tunnel barrier; and
   a second magnetic layer including at least one material selected from the group consisting of ferromagnetic materials and ferrimagnetic materials, wherein the first magnetic layer, the tunnel barrier, and the second magnetic layer form a magnetic tunnel junction in which:
   i) the amount of any deleterious oxide in the magnetic tunnel junction is sufficiently low; and
   ii) the magnetic tunnel junction is sufficiently free of defects,
   that the tunnel magnetoresistance of the magnetic tunnel junction is greater than 50% at room temperature.

2. The structure of claim 1, wherein at least one of the first magnetic layer and the second magnetic layer includes a spacer layer that is in contact with the tunnel barrier.

3. The structure of claim 1, wherein the tunnel barrier has a thickness of between 3 and 50 angstroms.

4. The structure of claim 1, in which:
   i) the amount of any deleterious oxide in the magnetic tunnel junction is sufficiently low; and
   i) the magnetic tunnel junction is sufficiently free of defects,
   that the tunnel magnetoresistance of the magnetic tunnel junction is greater than 70% at room temperature.

5. The structure of claim 1, wherein at least one of the first magnetic layer and the second magnetic layer includes antiferromagnetic material that is exchange biased with ferromagnetic material of said at least one layer, the antiferromagnetic material including at least one alloy selected from the group consisting of Ir—Mn and Pt—Mn, in which the alloy is substantially (100) oriented and is at least substantially fcc.

6. The structure of claim 1, wherein the first magnetic layer includes antiferromagnetic material over at least one layer selected from the group consisting of Ta and TaN.

7. The structure of claim 1, wherein the tunnel barrier is in direct contact with both ferromagnetic material of the first magnetic layer and ferromagnetic material of the second magnetic layer.

8. The structure of claim 1, wherein each of the magnetic layers is ferromagnetic, bcc, and substantially (100) oriented.

9. The structure of claim 1, wherein the first magnetic layer and the second magnetic layer each include ferromagnetic material selected from the group consisting of i) Fe, ii) an alloy of Co and Fe, iii) an alloy of Ni and Fe, and iv) an alloy of Ni and Fe and Co.

10. The structure of claim 1, wherein the tunnel junction has been annealed at a temperature of at least 180° C. to improve its tunnel magnetoresistance.

11. The structure of claim 1, wherein the tunnel junction has been annealed at a temperature of at least 220° C. to improve its tunnel magnetoresistance.

12. The structure of claim 1, wherein the tunnel junction has been annealed at a temperature of at least 360° C. to improve its tunnel magnetoresistance.

13. The structure of claim 1, wherein the tunnel barrier is substantially (100) oriented.

14. The structure of claim 1, wherein the tunnel barrier has the cubic rock salt structure.

15. The structure of claim 1, comprising a tunnel barrier in which the atomic concentration of Zn is greater than the atomic concentration of Mg.

16. A structure, comprising:
   a first ferromagnetic layer that is bcc and substantially (100) oriented;
   a magnesium-zinc oxide tunnel barrier that is substantially (100) oriented; and
   a second ferromagnetic layer that is bcc and substantially (100) oriented, wherein the first ferromagnetic layer, the tunnel barrier, and the second ferromagnetic layer form a magnetic tunnel junction having a tunnel magnetoresistance greater than 50% at room temperature.

17. A structure, comprising:
   a first magnetic layer;
   a magnesium-zinc oxide tunnel barrier; and
   a second magnetic layer, wherein the first magnetic layer, the tunnel barrier, and the second magnetic layer are in proximity with each other and form a magnetic tunnel junction, thereby permitting spin-polarized current to pass through the structure, and in which:
   i) the amount of any deleterious oxide in the magnetic tunnel junction is sufficiently low; and
   ii) the magnetic tunnel junction is sufficiently free of defects,
   that the tunnel magnetoresistance of the magnetic tunnel junction is greater than 100% at room temperature.

18. The structure of claim 17, wherein each of the magnetic layers is ferromagnetic, bcc, and substantially (100) oriented.

19. The structure of claim 18, wherein the tunnel barrier is substantially (100) oriented.

20. The structure of claim 19, wherein the tunnel junction has been annealed at a temperature of at least 220° C. to improve its tunnel magnetoresistance.

21. A structure, comprising:
   a first magnetic layer;
   a magnesium-zinc oxide tunnel barrier; and
   a second magnetic layer, wherein the first magnetic layer, the tunnel barrier, and the second magnetic layer are in proximity with each other and form a magnetic tunnel junction having a tunnel magnetoresistance of greater than 70% at room temperature, wherein the magnesium-zinc oxide tunnel barrier includes material having the hexagonal wurtzite structure.

22. The structure of claim 21, wherein the magnesium-zinc oxide tunnel barrier includes material having the cubic-rock salt structure.

* * * * *